US012587165B2

(12) United States Patent
Kimura et al.

(10) Patent No.: US 12,587,165 B2
(45) Date of Patent: Mar. 24, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Yutaka Kishimoto, Nagaokakyo (JP); Takeshi Nakao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 183 days.

(21) Appl. No.: 18/383,925

(22) Filed: Oct. 26, 2023

(65) Prior Publication Data

US 2024/0056050 A1 Feb. 15, 2024

Related U.S. Application Data

(63) Continuation of application No. PCT/JP2022/018186, filed on Apr. 19, 2022.

(60) Provisional application No. 63/187,508, filed on May 12, 2021, provisional application No. 63/182,053, filed on Apr. 30, 2021.

(51) Int. Cl.
| *H03H 9/13* | (2006.01) |
| *H03H 9/02* | (2006.01) |
| *H03H 9/60* | (2006.01) |

(52) U.S. Cl.
CPC ........ *H03H 9/132* (2013.01); *H03H 9/02015* (2013.01); *H03H 9/605* (2013.01)

(58) Field of Classification Search
CPC .... H03H 9/132; H03H 9/02015; H03H 9/605; H03H 9/564; H03H 9/568; H03H 9/589;

H03H 2003/021; H03H 2003/025; H03H 2003/0435; H03H 3/02; H03H 9/02157; H03H 9/587; H03H 9/02228
USPC .................................. 333/186–188, 193–196
See application file for complete search history.

(56) References Cited

U.S. PATENT DOCUMENTS

| 5,838,089 A | 11/1998 | Dreifus et al. |
| 2007/0085447 A1 | 4/2007 | Larson, III |
| 2007/0296523 A1 | 12/2007 | Yamakawa et al. |

(Continued)

FOREIGN PATENT DOCUMENTS

| JP | 10270978 A | 10/1998 |
| JP | 11136082 A | 5/1999 |

(Continued)

OTHER PUBLICATIONS

International Search Report in PCT/JP2022/018186, mailed Jul. 12, 2022, 4 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a piezoelectric board including a piezoelectric layer with a first principal surface and a second principal surface opposed to each other, an intermediate layer on the first principal surface or the second principal surface of the piezoelectric layer, and a functional electrode on the intermediate layer. A material of the intermediate layer is a same type as a material of the piezoelectric layer, and an electromechanical coupling coefficient of the intermediate layer is smaller than an electromechanical coupling coefficient of the piezoelectric layer.

25 Claims, 19 Drawing Sheets

(56)                    References Cited

U.S. PATENT DOCUMENTS

| | | | |
|---|---|---|---|
| 2010/0277036 A1* | 11/2010 | Shimizu ............. | H03H 9/02897 |
| | | | 310/313 B |
| 2012/0319530 A1 | 12/2012 | Burak et al. | |
| 2017/0155373 A1 | 6/2017 | Ruby et al. | |
| 2022/0216842 A1 | 7/2022 | Nagatomo et al. | |

FOREIGN PATENT DOCUMENTS

| | | | |
|---|---|---|---|
| JP | 2007116701 A | 5/2007 | |
| JP | 2008035493 A | 2/2008 | |
| JP | 2013005446 A | 1/2013 | |
| JP | 2020141337 A | 9/2020 | |
| WO | 2020209153 A1 | 10/2020 | |
| WO | 2021060523 A1 | 4/2021 | |

OTHER PUBLICATIONS

Written Opinion in PCT/JP2022/018186, mailed Jul. 12, 2022, 5 pages.

\* cited by examiner

REGION EXPRESSED
BY EXPRESSION (2)

REGION EXPRESSED
BY EXPRESSION (1)

REGION EXPRESSED
BY EXPRESSION (3)

REGION EXPRESSED
BY EXPRESSION (2)

ACOUSTIC WAVE DEVICE

CROSS REFERENCE TO RELATED APPLICATIONS

This application claims the benefit of priority to Provisional Application No. 63/187,508 filed on May 12, 2021 and Provisional Application No. 63/182,053 filed on Apr. 30, 2021, and is a Continuation Application of PCT Application No. PCT/JP2022/018186 filed on Apr. 19, 2022. The entire contents of each application are hereby incorporated herein by reference.

BACKGROUND OF THE INVENTION

1. Field of the Invention

The present invention relates to an acoustic wave device.

2. Description of the Related Art

Hitherto, acoustic wave devices are widely used in filters of mobile phones, and the like. International Publication No. 2021/060523 describes a plurality of examples of the acoustic wave devices. In an example of these, an additional film is provided on a piezoelectric layer. A plurality of pairs of electrodes is provided on the additional film. The electrodes are functional electrodes for exciting acoustic waves. The additional film is provided to adjust the frequency of an acoustic wave device. Examples of the material of the additional film include silicon oxide, silicon nitride, silicon oxynitride, alumina, and tantalum oxide.

SUMMARY OF THE INVENTION

When an additional film is provided between a piezoelectric layer and functional electrodes, the frequency and fractional band width of the acoustic wave device can be adjusted. However, when an additional film is provided as described above, the element capacitance of the acoustic wave device reduces. Therefore, to obtain a desired element capacitance, it is necessary to increase the size of the acoustic wave device.

Preferred embodiments of the present invention provide acoustic wave devices each capable of easily adjusting a fractional band width and resistant to reductions in element capacitance.

An acoustic wave device according to a preferred embodiment of the present invention includes a piezoelectric board including a piezoelectric layer with a first principal surface and a second principal surface opposed to each other, an intermediate layer on the first principal surface or the second principal surface of the piezoelectric layer, and a functional electrode on the intermediate layer. A material of the intermediate layer is a same type as a material of the piezoelectric layer, and an electromechanical coupling coefficient of the intermediate layer is smaller than an electromechanical coupling coefficient of the piezoelectric layer.

According to preferred embodiments of the present invention, it is possible to provide acoustic wave devices each capable of easily adjusting a fractional band width and resistant to reductions in element capacitance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that each of the preferred embodiments described in the specification is illustrative and that partial replacements or combinations of components are possible among different preferred embodiments.

Figure 1:
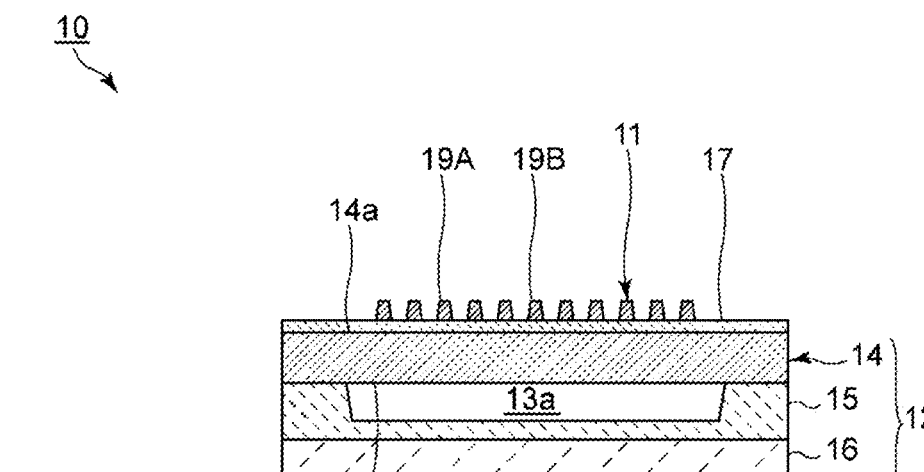
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention.

The acoustic wave device 10 is an acoustic wave resonator. The acoustic wave device 10 is used in, for example, a filter device, such as a band pass filter. The acoustic wave device 10 includes a piezoelectric board 12, an intermediate layer 17, and an interdigital transducer electrode 11 defining and functioning as a functional electrode. The piezoelectric board 12 includes a support member 13 and a piezoelectric layer 14. In the present preferred embodiment, the support member 13 includes a support substrate 16 and an electrically insulating layer 15. The electrically insulating layer 15 is provided on the support substrate 16. The piezoelectric layer 14 is provided on the electrically insulating layer 15. Of course, the support member 13 may be comprised of only the support substrate 16.

For example, a semiconductor, such as silicon, or ceramics, such as aluminum oxide, may be used as the material of the support substrate 16. An appropriate dielectric, such as silicon oxide and tantalum pentoxide, may be used as the material of the electrically insulating layer 15. The piezoelectric layer 14 is a lithium niobate (LN) layer in the present preferred embodiment. Specifically, the piezoelectric layer 14 is a monocrystal layer of lithium niobate. More specifically, the piezoelectric layer 14 is a ZYLN layer. Of course, lithium tantalate (LT), aluminum nitride, quartz crystal, or the like may be used as the material of the piezoelectric layer 14.

A cavity portion 13a is provided in the support member 13. More specifically, a recessed portion is provided in the electrically insulating layer 15. The piezoelectric layer 14 is provided on the electrically insulating layer 15 so as to close the recessed portion. The cavity portion 13a may be provided in the electrically insulating layer 15 and the support substrate 16 or may be provided only in the support substrate 16. The cavity portion 13a may be a through-hole provided in the support member 13. At least one cavity portion 13a just needs to be provided in the support member 13.

The piezoelectric layer 14 has a first principal surface 14a and a second principal surface 14b. The first principal surface 14a and the second principal surface 14b are opposed to each other. Of the first principal surface 14a and the second principal surface 14b, the second principal surface 14b is located adjacent to the support member 13. The intermediate layer 17 is provided on the first principal surface 14a of the piezoelectric layer 14. An interdigital transducer electrode 11 is provided on the intermediate layer 17.

Figure 2:
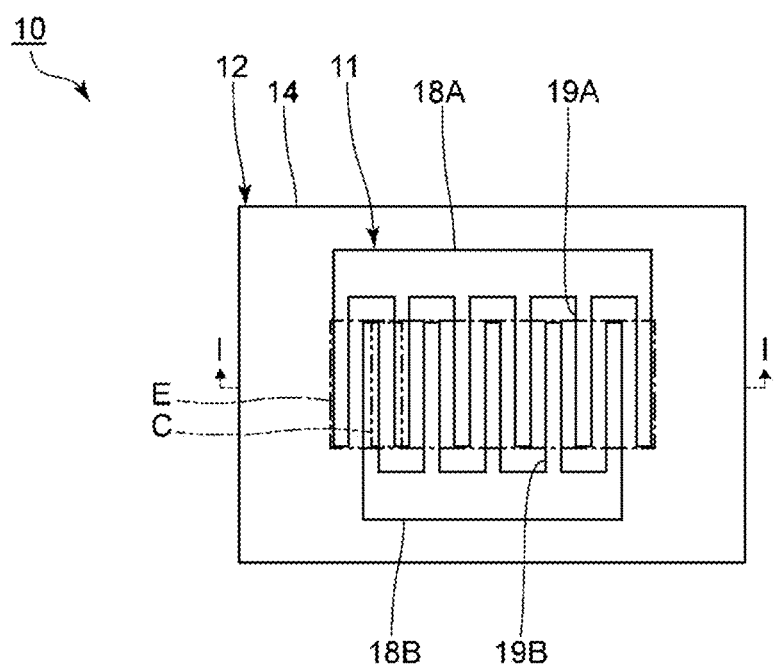
FIG. 2 is a plan view of the acoustic wave device according to the first preferred embodiment of the present invention.

FIG. 2 is a plan view of the acoustic wave device according to the first preferred embodiment. FIG. 1 is a cross-sectional view taken along the line I-I in FIG. 2.

The interdigital transducer electrode 11 includes a first busbar 18A and a second busbar 18B, and a plurality of first electrode fingers 19A and a plurality of second electrode fingers 19B. The first busbar 18A and the second busbar 18B are opposite to each other. One ends of the plurality of first electrode fingers 19A each are connected to the first busbar 18A. One ends of the plurality of second electrode fingers 19B each are connected to the second busbar 18B. The plurality of first electrode fingers 19A and the plurality of second electrode fingers 19B interdigitate with each other. The interdigital transducer electrode 11 may include a multilayer metal film or may include a single-layer metal film. Hereinafter, the first electrode fingers 19A and the second electrode fingers 19B may be simply referred to as electrode fingers.

Where a direction in which a plurality of electrode fingers is opposed to each other is set for an electrode finger opposed direction and a direction in which the plurality of electrode fingers extends is set for an electrode finger extending direction, the electrode finger opposed direction and the electrode finger extending direction are orthogonal to each other in the present preferred embodiment. When viewed in the electrode finger opposed direction, a region in which adjacent electrode fingers overlap is an overlapping region E. The overlapping region E is a region from the electrode finger of the interdigital transducer electrode 11 on one-side end to the electrode finger on the other-side end in the electrode finger opposed direction. More specifically, the overlapping region E includes a region from an outer-side end edge of the electrode finger on the one-side end in the electrode finger opposed direction to an outer-side end edge of the electrode finger on the other-side end in the electrode finger opposed direction.

In addition, the acoustic wave device 10 includes a plurality of excitation regions C. Acoustic waves are excited in the plurality of excitation regions C by applying an alternating-current voltage to the interdigital transducer electrode 11. In the present preferred embodiment, the acoustic wave device 10 is configured to be capable of using, for example, bulk waves in a thickness-shear mode, such as a first thickness-shear mode. The excitation regions C, as well as the overlapping region E, are also regions where adjacent electrode fingers overlap each other when viewed in the electrode finger opposed direction. Each of the excitation regions C is a region between a pair of electrode fingers. More specifically, each excitation region C is a region from the center of one electrode finger in the electrode finger opposed direction to the center of the other electrode finger in the electrode finger opposed direction. Thus, the overlapping region E includes the plurality of excitation regions C.

Of course, the acoustic wave device 10 may be configured to be capable of using plate waves, LN Love waves, and the like. In this case, the overlapping region E is an excitation region.

Referring back to FIG. 1, in a plan view, at least part of the interdigital transducer electrode 11 overlaps the cavity portion 13*a*. In the specification, a plan view means a view in a direction corresponding to a direction from an upper side in FIG. 1. In FIG. 1, for example, of the support substrate 16 and the piezoelectric layer 14, the piezoelectric layer 14 side is an upper side.

The cavity portion 13*a* is an acoustic reflection portion according to a preferred embodiment of the present invention. With the acoustic reflection portion, acoustic waves are suitably trapped at the piezoelectric layer 14 side. Instead of the cavity portion, an acoustic multilayer film (described later) may be provided.

The intermediate layer 17 is made of non-piezoelectric lithium niobate in the present preferred embodiment, for example. Non-piezoelectricity does not only indicate that piezoelectricity is not provided but also a case where slight piezoelectricity is provided. Of course, a material with non-piezoelectricity does not have piezoelectricity to such an extent that the material can be used as a piezoelectric material of a piezoelectric layer of an acoustic wave device. In the specification, a state where one member is made of one material includes a case where a member includes a small amount of impurities to such an extent that the electrical characteristics of an acoustic wave device do not significantly deteriorate.

Both the piezoelectric layer 14 and the intermediate layer 17 are made of lithium niobate, for example. Of course, as described above, the piezoelectric layer 14 is a monocrystal layer of lithium niobate. On the other hand, the intermediate layer 17 is a non-monocrystal layer of lithium niobate. More specifically, lithium niobate used for the intermediate layer 17 is in a polycrystalline state, an amorphous state, or an intermediate state between a polycrystalline state and an amorphous state. Therefore, an electromechanical coupling coefficient of the intermediate layer 17 is smaller than an electromechanical coupling coefficient of the piezoelectric layer 14.

Here, in the specification, materials of the same type include materials with different crystallinities or different orientations. Thus, the piezoelectric layer 14 and the intermediate layer 17 are made of materials of the same type with different crystallinities. Materials of the same type include materials of which major elements of each of the materials are of the same type and composition ratios of major elements are different from each other. For example, materials each made of Li, Nb, and O and respectively having different composition ratios of Li, Nb, and O are materials of the same type. In addition, when major elements of each of materials are of the same type and small amounts of impurities are doped in the respective materials, materials of the same type also include materials with different concentrations of impurities. Specifically, when, for example, the concentration of doped Fe, Mg, or the like is different between one lithium niobate and the other lithium niobate, materials of both are materials of the same type. Furthermore, materials of both in case where major elements of one and the other materials are of the same type, no impurities are doped in the one material, and slight amounts of impurities are doped in the other material are also included in materials of the same type.

Some of the unique features of the present preferred embodiment are that the material of the intermediate layer 17 is the same type as the material of the piezoelectric layer 14, and the electromechanical coupling coefficient of the intermediate layer 17 is smaller than the electromechanical coupling coefficient of the piezoelectric layer 14. With this configuration, the fractional band width of the acoustic wave device 10 can be easily adjusted, and the element capacitance of the acoustic wave device 10 is difficult to reduce. The details will be described below.

The fractional band width of the acoustic wave device 10 can be adjusted by adjusting the thickness of the intermediate layer 17. A fractional band width is expressed by |fr−fa|/fr×100[%] where the resonant frequency is fr and the anti-resonant frequency is fa. Here, a plurality of the acoustic wave devices 10 each having the configuration according to the present preferred embodiment with a different thickness of the intermediate layer 17 was prepared. Among the acoustic wave devices, the total thickness of the intermediate layer 17 and the piezoelectric layer 14 was set to the same thickness. The impedance frequency characteristics of each acoustic wave device were measured. Furthermore, the fractional band width of each acoustic wave device was calculated from the resonant frequency fr and anti-resonant frequency fa of the acoustic wave device. The design parameters of each of the examples of the acoustic wave devices 10 were as follows. An overlapping width in the following design parameters is a dimension of the overlapping region E in the electrode finger extending direction.

The piezoelectric layer 14 was made of ZYLN.

The intermediate layer 17 was made of LN, and the thickness was changed within the range greater than or equal to 0.0001 μm and less than or equal to 0.1 μm. In the range greater than or equal to 0.0001 μm and less than or equal to 0.01 μm, the thickness was set to 0.0001 μm or 0.01 μm, and, in the range greater than or equal to 0.01 μm and less than or equal to 0.1 μm, the thickness was changed in units of 0.01 μm.

The total thickness of the piezoelectric layer 14 and the intermediate layer 17 was 0.4 μm.

The interdigital transducer electrode 11 had 30 pairs of electrode fingers and had an overlapping width of 45.92 μm.

Figure 3:
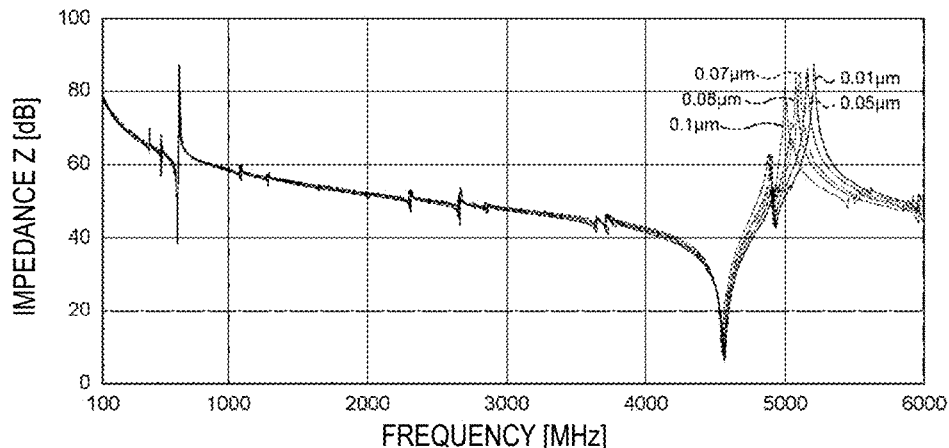
FIG. 3 is graph that shows the relationship between the thickness of an intermediate layer and impedance frequency characteristics according to the first preferred embodiment of the present invention.
Figure 4:
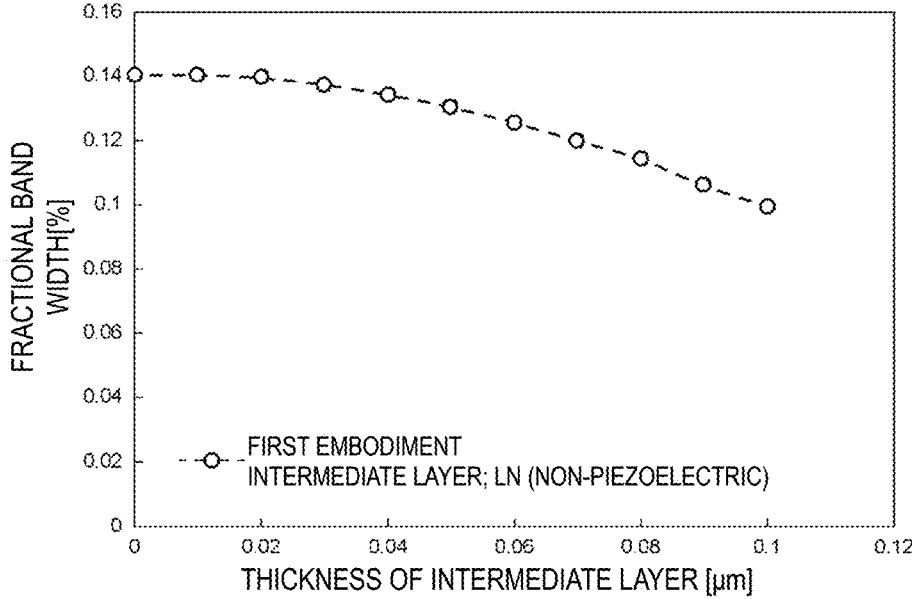
FIG. 4 is a graph that shows the relationship between the thickness of an intermediate layer and a fractional band width according to the first preferred embodiment of the present invention.

FIG. 3 is a graph that shows the relationship between the thickness of the intermediate layer and impedance frequency characteristics according to the first preferred embodiment. FIG. 4 is a graph that shows the relationship between the thickness of the intermediate layer and a fractional band width according to the first preferred embodiment. In FIG. 3, among the results obtained by changing the thickness of the intermediate layer 17, the results in the case where the thickness is about 0.01 μm, about 0.05 μm, about 0.07 μm, about 0.08 μm, or about 0.1 μm are shown, for example.

As shown in FIG. 3, it appears that, as the thickness of the intermediate layer 17 increases, a difference between the resonant frequency fr and the anti-resonant frequency fa reduces. As shown in FIG. 4, it appears that, as the thickness of the intermediate layer 17 increases, the value of the fractional band width reduces. In this way, it was discovered and confirmed that the fractional band width of the acoustic wave device 10 can be adjusted by adjusting the thickness of the intermediate layer 17.

The element capacitance of the acoustic wave device 10 and the element capacitance derived from impedance have a correlation. For this reason, the relationship between the thickness of the intermediate layer 17 and a capacitance curve was derived from the impedance frequency characteristics shown in FIG. 3. A capacitance curve indicates the relationship between frequency and capacitance. Specifically, where the impedance is Z, the capacitance is Cp, the electrical resistance is R, the inductance is L, the imaginary unit is j, and the angular velocity of alternating current is co, the relational expression $Z=R+j\omega L+(1/j\omega Cp)$ holds. The relationship shown in FIG. 5 below was derived from the relational expression.

Figure 5:
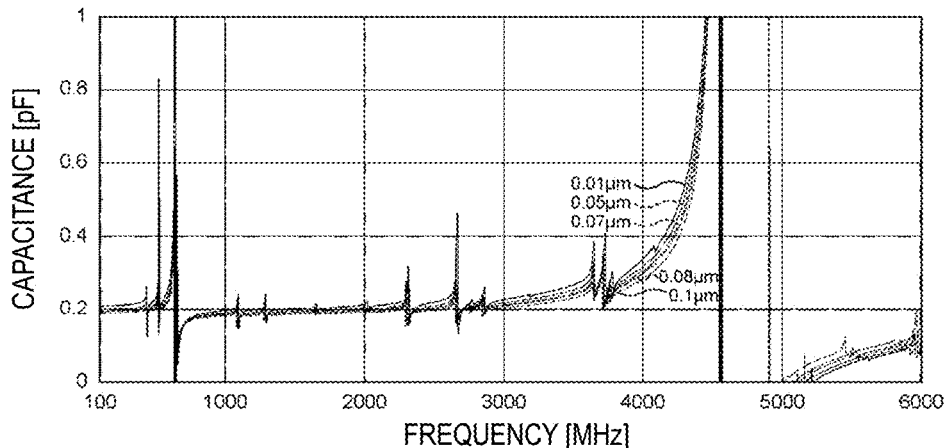
FIG. 5 is graph that shows the relationship between the thickness of an intermediate layer and a capacitance curve according to the first preferred embodiment of the present invention.

FIG. 5 is a graph that shows the relationship between the thickness of the intermediate layer and a capacitance curve according to the first preferred embodiment.

As shown in FIG. 5, as the thickness of the intermediate layer 17 increases, the capacitance reduces at the same frequency. Of course, in the first preferred embodiment, a change in capacitance is smaller than a change in the thickness of the intermediate layer 17. This will be described below by referring to a first comparative example.

The first comparative example differs from the first preferred embodiment in that an intermediate layer is made of SiO$_2$. A piezoelectric layer in the first comparative example is made of ZYLN as in the case of the first preferred embodiment. Here, a plurality of the acoustic wave devices according to the first comparative example each having a different thickness of the intermediate layer was prepared. The thicknesses of the intermediate layers in the acoustic wave devices according to the first comparative example were the same as the thicknesses of the intermediate layers in the acoustic wave devices according to the first preferred embodiment from which the relationship of FIG. 3 and the relationship of FIG. 4 were obtained. The impedance frequency characteristics of each of the acoustic wave devices according to the first comparative example were measured. The relationship between the thickness of the intermediate layer and a capacitance curve in the first comparative example was derived from these impedance frequency characteristics by using the above-described relational expression.

Figure 6:
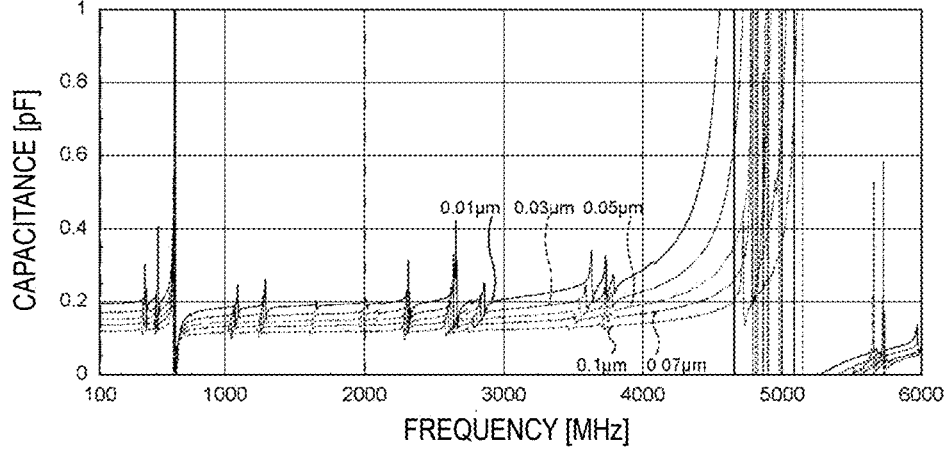
FIG. 6 is a graph that shows the relationship between the thickness of an intermediate layer and a capacitance curve according to a first comparative example.

FIG. 6 is a graph that shows the relationship between the thickness of the intermediate layer and a capacitance curve according to the first comparative example. In FIG. 6, among the results obtained by changing the thickness of the intermediate layer, the results in the case where the thickness is about 0.01 μm, about 0.03 μm, about 0.05 μm, about 0.07 μm, or about 0.1 μm are shown, for example.

As is apparent from a comparison between FIG. 6 and FIG. 5, the capacitance of the acoustic wave device is difficult to change even when the thickness of the intermediate layer is changed in the first preferred embodiment. Furthermore, FIG. 7 shows a comparison between the first preferred embodiment and the first comparative example.

Figure 7:
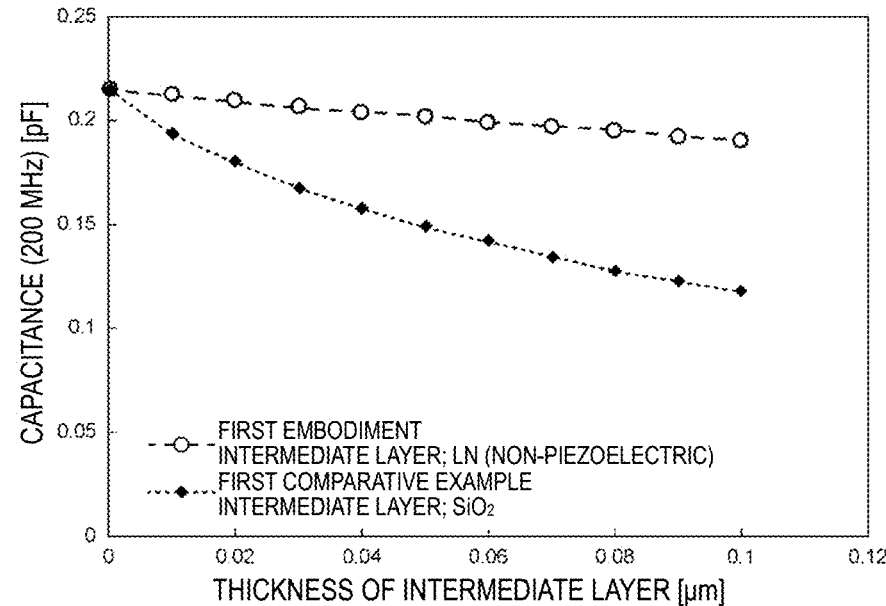
FIG. 7 is a graph that shows the relationship between the thickness of an intermediate layer and a capacitance at 200 MHz according to the first preferred embodiment of the present invention and the first comparative example.

FIG. 7 is a graph that shows the relationship between the thickness of the intermediate layer and a capacitance at 200 MHz according to the first preferred embodiment and the first comparative example.

As shown in FIG. 7, in the first comparative example, as the thickness of the intermediate layer increases, the capacitance significantly reduces. In contrast, as is apparent from FIG. 7, the capacitance is difficult to reduce even when the thickness of the intermediate layer increases in the first preferred embodiment.

Figure 8:
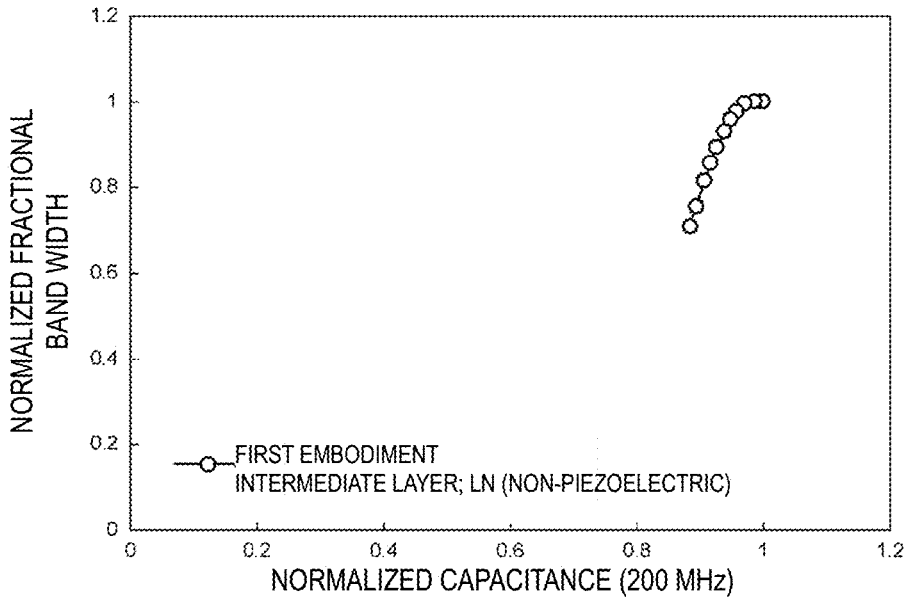
FIG. 8 is a graph that shows the relationship between a normalized capacitance and a normalized fractional band width according to the first preferred embodiment of the present invention.

Here, FIG. 8 shows the relationship between a capacitance and a fractional band width in the first preferred embodiment. More specifically, FIG. 8 shows the relationship between a normalized capacitance and a normalized fractional band width. A normalized capacitance is a capacitance normalized by a capacitance at the time when the thickness of the intermediate layer 17 is about 0.0001 μm, for example. A normalized fractional band width is a fractional band width normalized by a fractional band width at the time when the thickness of the intermediate layer 17 is about 0.0001 μm, for example.

FIG. 8 is a graph that shows the relationship between a normalized capacitance and a normalized fractional band width in the first preferred embodiment. Plots in FIG. 8 indicate normalized capacitances and normalized fractional band widths at the time when the thickness of the intermediate layer 17 is the same.

As shown in FIG. 8, as the normalized fractional band width changes, the normalized capacitance also changes. The normalized fractional band width changes from one to about 0.7, for example. In contrast, it appears that the width in which the normalized capacitance reduces from one is narrow. As described above, a capacitance and an element capacitance have a correlation. Therefore, it was discovered and confirmed that, even when the fractional band width is changed, the width in which the element capacitance reduces is narrow. Thus, in the first preferred embodiment, the fractional band width of the acoustic wave device 10 can be easily adjusted by changing the thickness of the intermediate layer 17, and the element capacitance of the acoustic wave device 10 is difficult to reduce. Therefore, when a desired element capacitance is obtained, it is less likely to lead to an increase in the size of the acoustic wave device 10.

In the first preferred embodiment, since the piezoelectric layer 14 and the intermediate layer 17 are made of materials of the same type, a difference in dielectric constant between the piezoelectric layer 14 and the intermediate layer 17 is small. Thus, a reduction in element capacitance is decreased or prevented. In addition, since the electromechanical coupling coefficient of the intermediate layer 17 is smaller than the electromechanical coupling coefficient of the piezoelectric layer 14, a fractional band width can be suitably adjusted by changing the thickness of the intermediate layer 17.

At the time of determining the magnitude relation in electromechanical coupling coefficient between the intermediate layer 17 and the piezoelectric layer 14, for example, a finite element method (FEM) just needs to be used. More specifically, the results of FEM calculation of the following 1) and 2) just need to be compared with the results of actual measurements. 1) FEM calculation is performed on the assumption that the intermediate layer 17 and the piezoelectric layer 14 have the same electromechanical coupling coefficient. 2) FEM calculation is performed on the assumption that the electromechanical coupling coefficient of the intermediate layer 17 is smaller by, for example, about 10% or about 20% than the electromechanical coupling coefficient of the piezoelectric layer 14. When the result of actual measurement coincides with the result of 1), the electromechanical coupling coefficient of the intermediate layer 17 and the electromechanical coupling coefficient of the piezoelectric layer 14 are the same. On the other hand, when the result of actual measurement coincides with the result of 2), the electromechanical coupling coefficient of the intermediate layer 17 is smaller than the electromechanical coupling coefficient of the piezoelectric layer 14.

At the time of identifying the intermediate layer 17 and the piezoelectric layer 14, for example, the cross section of an end product just needs to be observed with a transmission electron microscope (TEM) or a scanning electron microscope (SEM).

Incidentally, the crystallinity and the electromechanical coupling coefficient have a correlation. Therefore, as in the case of the first preferred embodiment, preferably, the intermediate layer 17 is not a monocrystal layer, and the piezoelectric layer 14 is a monocrystal layer. Therefore, the electromechanical coupling coefficient of the intermediate layer 17 can be further reliably made smaller than the electromechanical coupling coefficient of the piezoelectric layer 14.

The orientation and the electromechanical coupling coefficient also have a correlation. When the orientation of the intermediate layer 17 is lower than the orientation of the piezoelectric layer 14, the electromechanical coupling coefficient of the intermediate layer 17 is smaller than the electromechanical coupling coefficient of the piezoelectric layer 14. The intermediate layer 17 is preferably not a monocrystal layer and has no orientation. In this case, the electromechanical coupling coefficient of the intermediate layer 17 can be more reliably made smaller than the electromechanical coupling coefficient of the piezoelectric layer 14.

The intermediate layer 17 is more preferably not piezoelectric. Thus, the electric mechanical coupling coefficient of the intermediate layer 17 can be further reduced.

The intermediate layer 17 can be formed by, for example, sputtering or the like. A temperature at which the intermediate layer 17 is formed is preferably lower than or equal to about 700° C., more preferably lower than or equal to about 600° C., further preferably lower than or equal to about 500° C., furthermore preferably lower than or equal to about 400° C., and much more preferably lower than or equal to about 300° C., for example. Thus, the intermediate layer 17 is further reliably set to non-piezoelectricity.

An LN layer corresponding to the intermediate layer 17 was formed by sputtering at a temperature higher than or equal to about 100° C. and lower than or equal to about 500° C., for example. The orientation of the LN layer was evaluated by using X-ray diffraction (XRD). With the result of the evaluation, it was determined that the LN layer was not a c-axis orientation film but was amorphous and had no orientation. At the time of the evaluation, the LN layer was formed on a Z-cut LT substrate, and the orientation of the LN layer was evaluated by using XRD. This is because, if the LN layer that is a non-monocrystal layer is formed on a monocrystal Z-cut LN substrate, it is difficult to determine a difference between a monocrystal and a non-monocrystal by XRD.

The thickness of the intermediate layer 17 is preferably less than or equal to about 150 nm, for example. In this case, the intermediate layer 17 is easily formed as a non-monocrystal layer, so productivity is enhanced.

A difference between the dielectric constant of the intermediate layer 17 and the dielectric constant of the piezoelectric layer 14 is preferably smaller than or equal to about 10% of the dielectric constant of the piezoelectric layer 14, for example. More specifically, where the dielectric constant of the piezoelectric layer 14 is $\varepsilon a$ and the dielectric constant of the intermediate layer 17 is $\varepsilon b$, about $0.9\varepsilon a \leq \varepsilon b \leq$ about $1.1\varepsilon a$, for example, is preferably satisfied. In this case, at the time of adjusting a fractional band width, a reduction in element capacitance is further reliably decreased or prevented.

The piezoelectric layer 14 in the first preferred embodiment is made of ZYLN. In other words, Euler angles ($\varphi$, $\theta$, $\psi$) of the piezoelectric layer 14 are (0°, 0°, 90°), for example. It is already discovered and confirmed that, when $\varphi$, $\theta$, and $\psi$ in the Euler angles each fall within the range of about ±10°, results similar to the results shown in FIG. 8 and the like are obtained. Thus, the Euler angles of the piezoelectric layer 14 are preferably respectively fall within (the range of 0°±10°, the range of 0°±10°, the range of 90°±10°, for example. With this configuration, the fractional band width can be easily adjusted, and the element capacitance is difficult to reduce.

Figure 9:
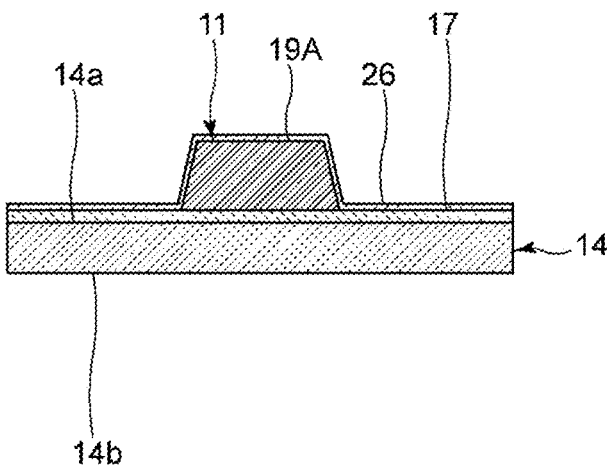
FIG. 9 is an elevational cross-sectional view, showing an area around an electrode finger, of an acoustic wave device according to a first modification of the first preferred embodiment of the present invention.

The interdigital transducer electrode 11 shown in FIG. 1 may be covered with a dielectric film. For example, in a first modification of the first preferred embodiment, shown in FIG. 9, a dielectric film 26 is provided on the intermediate layer 17 so as to cover the interdigital transducer electrode 11. In this case, the interdigital transducer electrode 11 is less likely to break. For example, silicon oxide, silicon nitride, silicon oxynitride, or the like may be used as the material of the dielectric film 26. In the present modification as well, as in the case of the first preferred embodiment, the fractional band width can be easily adjusted, and the element capacitance is difficult to reduce.

Figure 10:
FIG. 10 is an elevational cross-sectional view of an acoustic wave device according to a second modification of the first preferred embodiment of the present invention.
Figure 10:
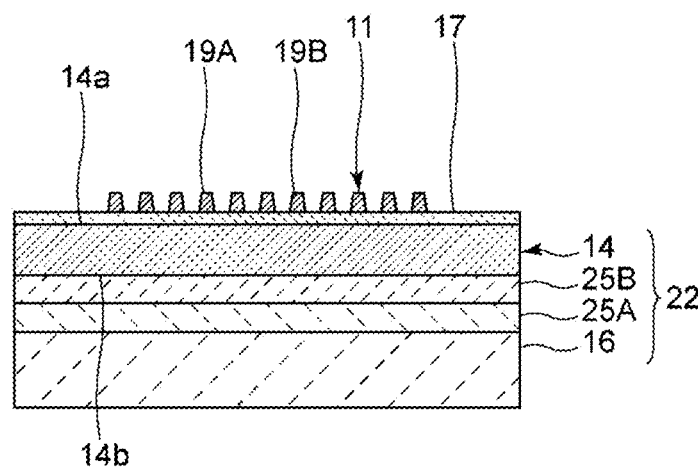

As shown in FIG. 1, the piezoelectric board 12 preferably includes the cavity portion 13a as an acoustic reflection portion. Of course, the configuration of the piezoelectric board 12 is not limited thereto. For example, in a second modification of the first preferred embodiment, shown in FIG. 10, a piezoelectric board 22 includes the support substrate 16, a high acoustic velocity film 25A defining and functioning as a high acoustic velocity material layer, and a low acoustic velocity film 25B. The high acoustic velocity film 25A is provided on the support substrate 16. The low acoustic velocity film 25B is provided on the high acoustic velocity film 25A. The piezoelectric layer 14 is provided on the low acoustic velocity film 25B.

A high acoustic velocity material layer is a relatively high acoustic velocity layer. An acoustic velocity of bulk waves that propagate in the high acoustic velocity material layer is higher than an acoustic velocity of acoustic waves that propagate in the piezoelectric layer 14. Examples of the material of the high acoustic velocity material layer include a medium containing a material, such as silicon, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a diamondlike carbon (DLC) film, and diamond, as a main component.

The low acoustic velocity film 25B is a relatively low acoustic velocity film. More specifically, an acoustic velocity of bulk waves that propagate in the low acoustic velocity film 25B is lower than an acoustic velocity of bulk waves that propagate in the piezoelectric layer 14. Examples of the material of the low acoustic velocity film 25B include glass, silicon oxide, silicon oxynitride, lithium oxide, tantalum pentoxide, and a chemical compound obtained by adding fluorine, carbon, or boron to silicon oxide, as a main component.

In the present modification, in the piezoelectric board 22, the high acoustic velocity film 25A defining and functioning as the high acoustic velocity material layer, the low acoustic velocity film 25B, and the piezoelectric layer 14 are laminated in this order. Thus, the energy of acoustic waves can be effectively trapped at the piezoelectric layer 14 side.

The piezoelectric board may be a multilayer substrate including a support substrate, a high acoustic velocity film, and a piezoelectric layer. Furthermore, the high acoustic velocity material layer may be a high acoustic velocity support substrate. In this case, the piezoelectric board may be a multilayer substrate including a high acoustic velocity support substrate, a low acoustic velocity film, and a piezoelectric layer, or a multilayer substrate including a high acoustic velocity support substrate and a piezoelectric layer. In these cases as well, the energy of acoustic waves can be effectively trapped at the piezoelectric layer side. In addition, in these examples and the second modification as well, as in the case of the first preferred embodiment, the fractional band width can be easily adjusted, and the element capacitance is difficult to reduce.

In the examples described in the first preferred embodiment, the first modification, and the second modification, an example in which the piezoelectric board is a multilayer substrate has been described. Of course, the piezoelectric board may be a piezoelectric substrate including only a piezoelectric layer. It is applicable as long as the material of the intermediate layer is the same type as the material of the piezoelectric substrate and the electromechanical coupling coefficient of the intermediate layer is smaller than the electromechanical coupling coefficient of the piezoelectric substrate. Thus, even when the piezoelectric board is a piezoelectric substrate as well, the fractional band width can be easily adjusted, and the element capacitance is difficult to reduce.

In the first preferred embodiment, the intermediate layer 17 is provided on the first principal surface 14a of the piezoelectric layer 14. The interdigital transducer electrode 11 is provided indirectly on the first principal surface 14a with the intermediate layer 17 interposed therebetween. Of course, the intermediate layer 17 may be provided on the second principal surface 14b of the piezoelectric layer 14. The interdigital transducer electrode 11 may be provided indirectly on the second principal surface 14b with the intermediate layer 17 interposed therebetween. In this case, the interdigital transducer electrode 11 is located in, for example, the cavity portion 13a.

Incidentally, in the above-description, a comparison between the first preferred embodiment and the first comparative example, in which the piezoelectric layer is made of ZYLN, has been described. Of course, the material of the piezoelectric layer is not limited thereto. In the following description, a comparison between a second preferred embodiment and a second comparative example, in which the piezoelectric layer is made of 120YXLN, will be described. In the second preferred embodiment, only the Euler angles ($\varphi$, $\theta$, $\psi$) of the piezoelectric layer differ from those of the first preferred embodiment. For this reason, the description of the second preferred embodiment uses reference signs used in the description of the first preferred embodiment.

A plurality of the acoustic wave devices 10 each having the configuration according to the second preferred embodiment with a different thickness of the intermediate layer 17 was prepared. The total thickness of the intermediate layer 17 and the piezoelectric layer 14 of each of the acoustic wave devices was set to the same thickness. The impedance frequency characteristics of each acoustic wave device were measured. The fractional band width of each acoustic wave device was calculated from the resonant frequency fr and anti-resonant frequency fa of the acoustic wave device. Furthermore, the relationship between the thickness of the intermediate layer 17 and a capacitance curve was derived from the impedance frequency characteristics by using the above-described relational expression. The design parameters of each of the examples of the acoustic wave devices 10 were as follows.

The piezoelectric layer 14 was made of 120YXLN.

The intermediate layer 17 was made of LN, and the thickness was changed within the range greater than or equal to 0.0001 µm and less than or equal to 0.1 µm. In the range greater than or equal to 0.0001 µm and less than or equal to 0.01 µm, the thickness was set to 0.0001 µm or 0.01 µm, and, in the range greater than or equal to 0.01 µm and less than or equal to 0.1 µm, the thickness was changed in units of 0.01 µm.

The total thickness of the piezoelectric layer 14 and intermediate layer 17 was 0.455 µm.

The interdigital transducer electrode 11 had 30 pairs of electrode fingers and had an overlapping width of 45.92 µm.

Figure 11:
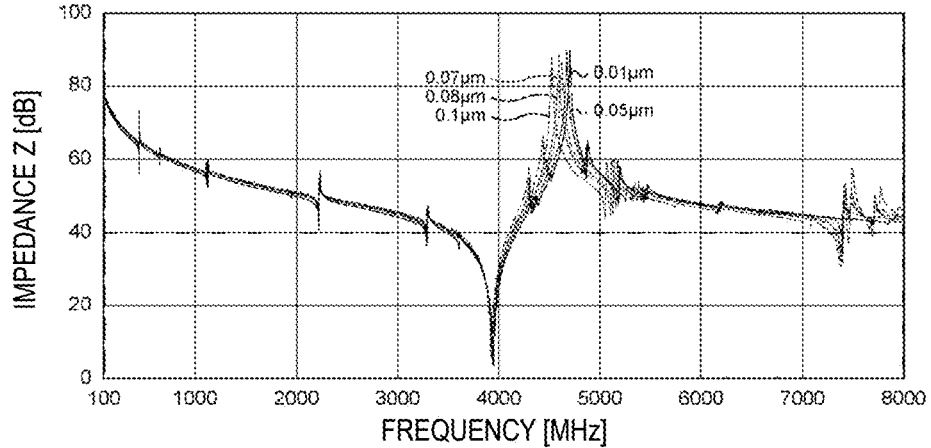
FIG. 11 is a graph that shows the relationship between the thickness of an intermediate layer and impedance frequency characteristics according to a second preferred embodiment of the present invention.
Figure 12:
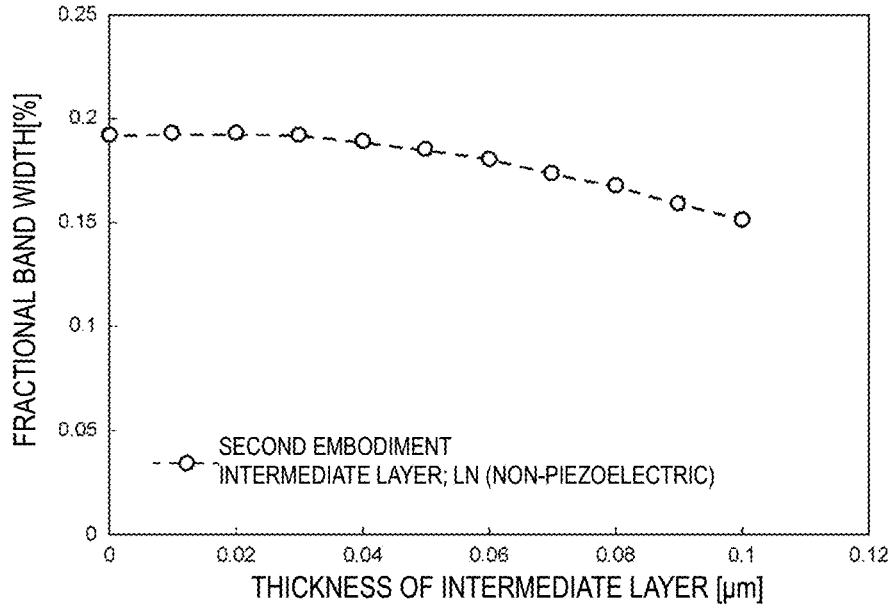
FIG. 12 is a graph that shows the relationship between the thickness of an intermediate layer and a fractional band width according to the second preferred embodiment of the present invention.
Figure 13:
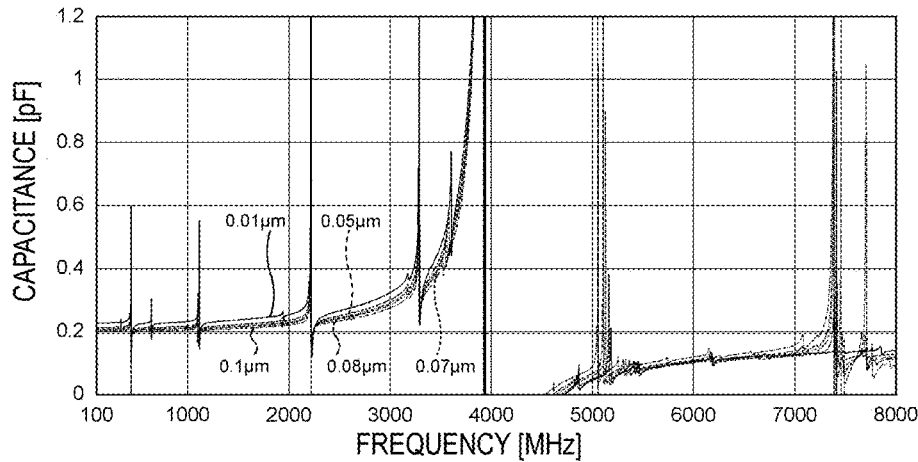
FIG. 13 is a graph that shows the relationship between the thickness of an intermediate layer and a capacitance curve according to the second preferred embodiment of the present invention.

FIG. 11 is a graph that shows the relationship between the thickness of the intermediate layer and impedance frequency characteristics according to the second preferred embodiment. FIG. 12 is a graph that shows the relationship between the thickness of the intermediate layer and a fractional band width according to the second preferred embodiment. FIG. 13 is a graph that shows the relationship between the thickness of the intermediate layer and a capacitance curve according to the second preferred embodiment. In FIGS. 11 and 13, among the results obtained by changing the thickness of the intermediate layer, the results in the case where the thickness is about 0.01 µm, about 0.05 µm, about 0.07 µm, about 0.08 µm, or about 0.1 µm are shown, for example.

As shown in FIG. 11, it appears that, as the thickness of the intermediate layer 17 increases, a difference between the resonant frequency fr and the anti-resonant frequency fa reduces. As shown in FIG. 12, it appears that, as the thickness of the intermediate layer 17 increases, the value of the fractional band width reduces. As shown in FIG. 13, as the thickness of the intermediate layer 17 increases, the capacitance reduces at the same frequency.

The second comparative example differs from the second preferred embodiment in that an intermediate layer is made of $SiO_2$. A plurality of the acoustic wave devices according to the second comparative example each having a different thickness of the intermediate layer was prepared. The thicknesses of the intermediate layers in the acoustic wave devices according to the second comparative example were the same as the thicknesses of the intermediate layers in the acoustic wave devices according to the second preferred embodiment from which the relationship of FIG. 11 and the relationship of FIG. 13 were obtained. The impedance frequency characteristics of each of the acoustic wave devices according to the second comparative example were measured. The relationship between the thickness of the intermediate layer and a capacitance curve in the second comparative example was derived from these impedance frequency characteristics.

Figure 14:
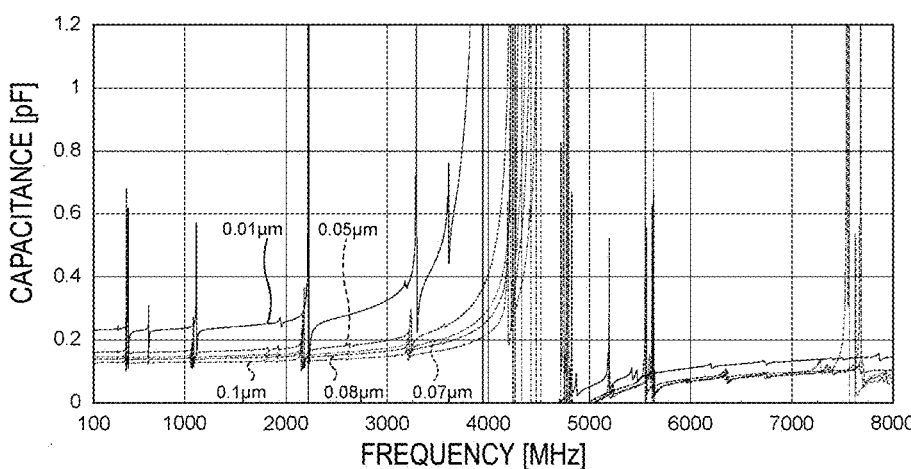
FIG. 14 is a graph that shows the relationship between the thickness of an intermediate layer and a capacitance curve according to a second comparative example.

FIG. 14 is a graph that shows the relationship between the thickness of the intermediate layer and a capacitance curve according to the second comparative example. In FIG. 14, among the results obtained by changing the thickness of the intermediate layer, the results in the case where the thickness is about 0.01 μm, about 0.05 μm, about 0.07 μm, about 0.08 μm, or about 0.1 μm are shown, for example.

As shown in FIG. 14, in the second comparative example, it appears that a change in capacitance is larger than a change in the thickness of the intermediate layer. As is apparent from a comparison between FIGS. 13 and 14, the capacitance of the acoustic wave device is difficult to change even when the thickness of the intermediate layer is changed in the second preferred embodiment. Furthermore, FIG. 15 shows a comparison between the second preferred embodiment and the second comparative example.

Figure 15:
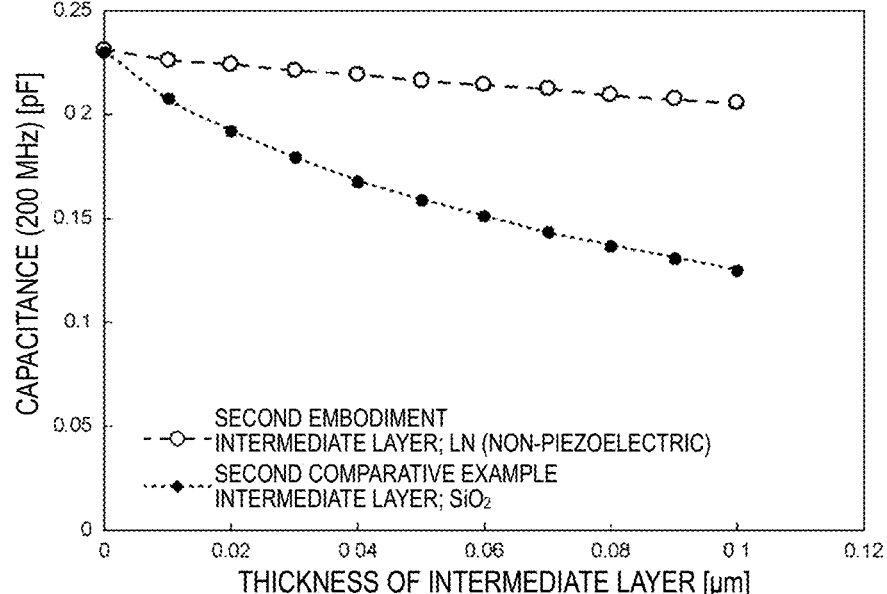
FIG. 15 is a graph that shows the relationship between the thickness of an intermediate layer and a capacitance at 200 MHz according to the second preferred embodiment of the present invention and the second comparative example.

FIG. 15 is graph that shows the relationship between the thickness of the intermediate layer and a capacitance at 200 MHz according to the second preferred embodiment and the second comparative example.

As shown in FIG. 15, in the second comparative example, as the thickness of the intermediate layer increases, the capacitance significantly reduces. In contrast, as is apparent from FIG. 15, the capacitance is difficult to reduce even when the thickness of the intermediate layer increases in the second preferred embodiment.

Figure 16:
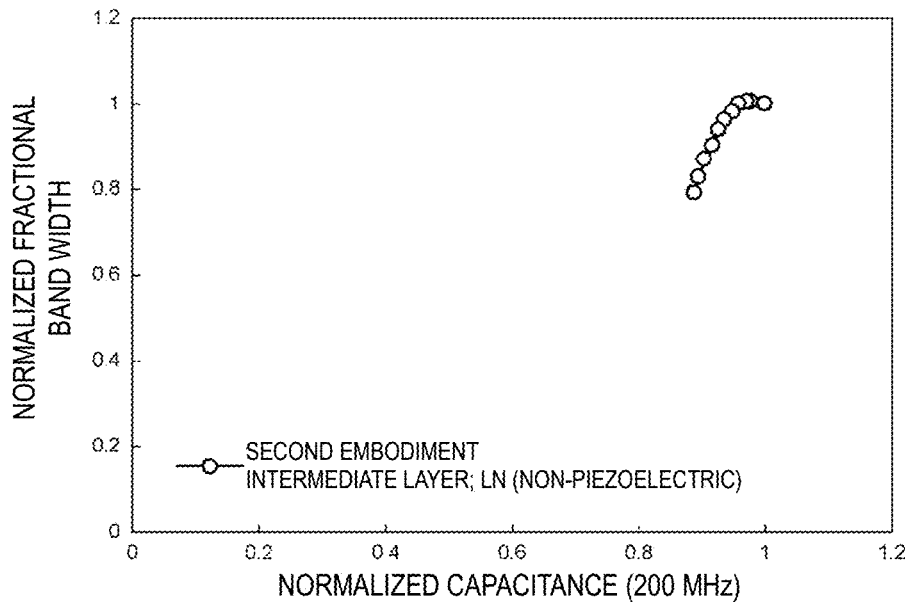
FIG. 16 is a graph that shows the relationship between a normalized capacitance and a normalized fractional band width according to the second preferred embodiment of the present invention.

FIG. 16 is a graph that shows the relationship between a normalized capacitance and a normalized fractional band width in the second preferred embodiment. Plots in FIG. 16 indicate normalized capacitances and normalized fractional band widths at the time when the thickness of the intermediate layer 17 is the same.

As shown in FIG. 16, as the normalized fractional band width changes, the normalized capacitance also changes. It was discovered and confirmed that, when the normalized fractional band width changes, the width in which the normalized capacitance reduces from one is narrow. From the correlation between a capacitance and an element capacitance, the width in which the element capacitance reduces is narrow. Thus, in the second preferred embodiment, the fractional band width of the acoustic wave device 10 can be easily adjusted by changing the thickness of the intermediate layer 17, and the element capacitance of the acoustic wave device 10 is difficult to reduce. Therefore, when a desired element capacitance is obtained, it is less likely to lead to an increase in the size of the acoustic wave device 10.

The piezoelectric layer 14 in the second preferred embodiment is made of 120YXLN. In other words, Euler angles (φ, θ, ψ) of the piezoelectric layer 14 are (0°, 30°, 0°), for example. It is already discovered and confirmed that, when φ, θ, and ψ in the Euler angles each fall within the range of about ±10°, for example, results similar to the results shown in FIG. 16 and the like are obtained. Thus, the Euler angles (φ, θ, ψ) of the piezoelectric layer 14 are preferably respectively fall within (the range of 0°±10°, the range of 30°±10°, the range of 0°±10°), for example. With this configuration, the fractional band width can be easily adjusted, and the element capacitance is difficult to reduce.

Preferred embodiments of the present invention are applicable even when the acoustic wave device is a bulk acoustic wave (BAW) element. This example will be described below.

Figure 17:
FIG. 17 is an elevational cross-sectional view of an acoustic wave device according to a third preferred embodiment of the present invention.
Figure 17:
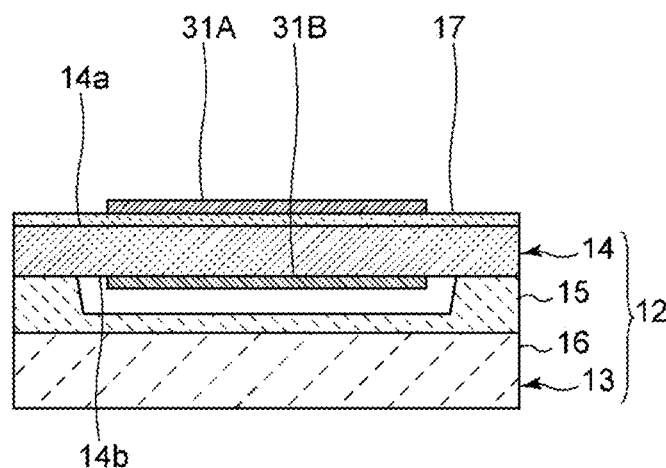

FIG. 17 is an elevational cross-sectional view of an acoustic wave device according to a third preferred embodiment.

The present preferred embodiment differs from the first preferred embodiment in that a functional electrode includes an upper electrode 31A and a lower electrode 31B. Other than the above points, an acoustic wave device 30 according to the present preferred embodiment has a similar configuration to that of the acoustic wave device 10 according to the first preferred embodiment.

The upper electrode 31A is provided to the first principal surface 14a of the piezoelectric layer 14. The lower electrode 31B is provided on the second principal surface 14b of the piezoelectric layer 14. The upper electrode 31A and the lower electrode 31B are opposed to each other with the piezoelectric layer 14 interposed therebetween. The upper electrode 31A and the lower electrode 31B are respectively connected to potentials different from each other. A region in which the upper electrode 31A and the lower electrode 31B are opposed to each other is an excitation region. When an alternating-current electric field is applied between the upper electrode 31A and the lower electrode 31B, acoustic waves are excited in the excitation region.

The intermediate layer 17 is provided between the piezoelectric layer 14 and the upper electrode 31A defining and functioning as the functional electrode. Thus, as in the case of the first preferred embodiment, the fractional band width can be easily adjusted, and the element capacitance is difficult to reduce.

The intermediate layer 17 is provided between the piezoelectric layer 14 and at least one of the upper electrode 31A and the lower electrode 31B. In this case as well, the fractional band width can be easily adjusted, and the element capacitance is difficult to reduce.

Acoustic wave device according to preferred embodiments of the present invention can be used for a ladder filter or the like. This example will be described below.

Figure 18:
FIG. 18 is a circuit diagram of a ladder filter according to a fourth preferred embodiment of the present invention.
Figure 18:
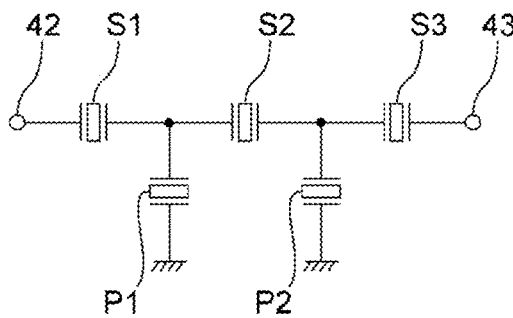

FIG. 18 is a circuit diagram of a ladder filter according to a fourth preferred embodiment.

A ladder filter 40 includes a first signal terminal 42, a second signal terminal 43, a plurality of series arm resonators, and a plurality of parallel arm resonators. In the present preferred embodiment, all the plurality of series arm resonators and the plurality of parallel arm resonators are acoustic wave resonators. All the plurality of series arm resonators and the plurality of parallel arm resonators are the acoustic wave devices according to a preferred embodiment of the present invention. At least one acoustic wave resonator in the ladder filter 40 just needs to be an acoustic wave device according to a preferred embodiment of the present invention.

The first signal terminal 42 is an antenna terminal. The antenna terminal is connected to an antenna. The first signal terminal 42 is not limited to the antenna terminal. Each of the first signal terminal 42 and the second signal terminal 43 may be, for example, configured as an electrode pad or may be configured as a wire.

The plurality of series arm resonators according to the present preferred embodiment specifically includes a series arm resonator S1, a series arm resonator S2, and a series arm resonator S3. The plurality of parallel arm resonators specifically includes a parallel arm resonator P1 and a parallel arm resonator P2.

The series arm resonator S1, the series arm resonator S2, and the series arm resonator S3 are connected in series between the first signal terminal 42 and the second signal terminal 43. The parallel arm resonator P1 is connected between a ground potential and a junction point between the series arm resonator S1 and the series arm resonator S2. The parallel arm resonator P2 is connected between the ground potential and a junction point between the series arm resonator S2 and the series arm resonator S3. The circuit configuration of the ladder filter 40 is not limited to the above configuration. The ladder filter 40 just needs to include at least one series arm resonator and at least one parallel arm resonator.

Each of the acoustic wave resonators of the ladder filter 40 is an acoustic wave device according to a preferred embodiment of the present invention. Thus, in each of the acoustic wave resonators, the fractional band width can be easily adjusted, and the element capacitance is difficult to reduce. Therefore, it is possible to adjust the fractional band width of each of the acoustic wave resonators without leading to an increase in the size of the ladder filter 40.

A steepness at the end portions of the pass band of the ladder filter 40 can be enhanced by using an acoustic wave resonator with a small fractional band width. In the specification, a high steepness means that a variation in frequency to a certain variation in attenuation is small around the end portions of the pass band. As the steepness increases, passage of an unnecessary signal through the ladder filter 40 is further reliably reduced or prevented.

As in the case of the examples shown in FIGS. 8 and 16, in an acoustic wave device according to a preferred embodiment of the present invention, the element capacitance is difficult to reduce even when the fractional band width is reduced. The ladder filter 40 includes an acoustic wave device according to a preferred embodiment of the present invention as each of the acoustic wave resonators. Therefore, with the ladder filter 40, it is possible to enhance the steepness without leading to an increase in size.

Incidentally, the plurality of acoustic wave resonators of the ladder filter 40 includes a first acoustic wave resonator and a second acoustic wave resonator. In the present preferred embodiment, the first acoustic wave resonator is the parallel arm resonator P2. The second acoustic wave resonator is the series arm resonator S3. Both the first acoustic wave resonator and the second acoustic wave resonator may be series arm resonators or may be parallel arm resonators.

Figure 19:
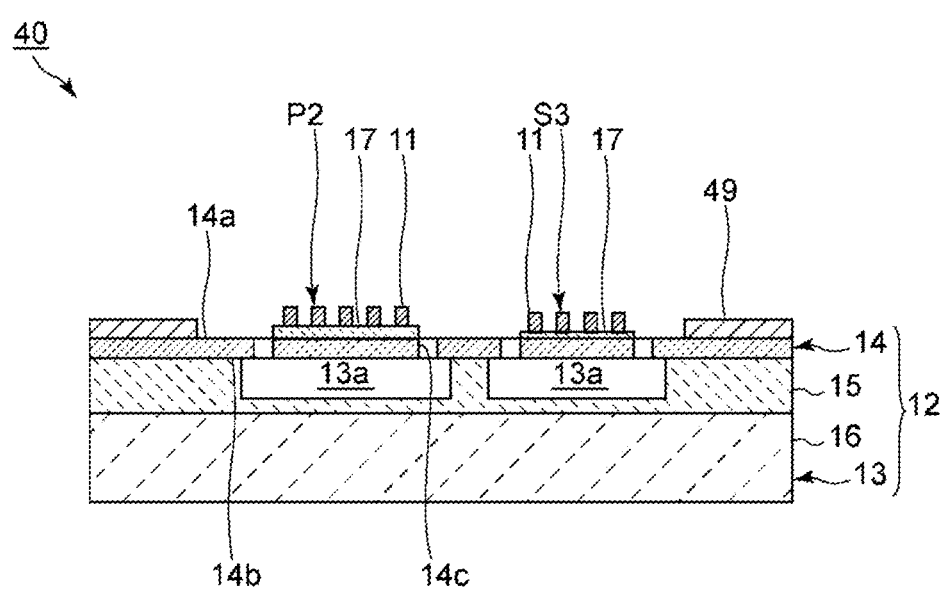
FIG. 19 is a schematic elevational cross-sectional view of a series arm resonator and a parallel arm resonator according to the fourth preferred embodiment of the present invention.

FIG. 19 is a schematic elevational cross-sectional view of the series arm resonator and the parallel arm resonator according to the fourth preferred embodiment.

The plurality of acoustic wave resonators of the ladder filter 40 shares the piezoelectric board 12. The piezoelectric layer 14 includes a plurality of through-holes 14c. The through-holes 14c are used to remove a sacrificial layer and to form the cavity portion 13a at the time of obtaining each acoustic wave resonator. FIG. 19 schematically shows the series arm resonator S3 and the parallel arm resonator P2 arranged side by side. Of course, the positions of the acoustic wave resonators in the ladder filter 40 are not limited. A wire 49 is provided on the piezoelectric layer 14. The wire 49 is electrically connected to the interdigital transducer electrode 11.

The thickness of the intermediate layer 17 of the parallel arm resonator P2 defining and functioning as the first acoustic wave resonator and the thickness of the intermediate layer 17 of the series arm resonator S3 defining and functioning as the second acoustic wave resonator are different from each other. In the above description, it has been demonstrated that the fractional band width of the acoustic wave resonator can be adjusted by adjusting the thickness of the intermediate layer 17. The frequency of the acoustic wave resonator can also be adjusted by adjusting the thickness of the intermediate layer 17. Thus, in the present preferred embodiment, it is possible to suitably differentiate the frequency of the first acoustic wave resonator and the frequency of the second acoustic wave resonator, and both element capacitances are difficult to reduce.

In the ladder filter 40, the thickness of the intermediate layer 17 of the parallel arm resonator P2 defining and functioning as the first acoustic wave resonator is greater than the thickness of the intermediate layer 17 of the series arm resonator S3 defining and functioning as the second acoustic wave resonator. Thus, the frequency of the parallel arm resonator P2 can be suitably made lower than the frequency of the series arm resonator S3.

In the present preferred embodiment, the intermediate layer 17 is configured as in the case of the first preferred embodiment. In other words, the intermediate layer 17 is a non-monocrystal layer made of a material of the same type as the piezoelectric layer 14. Thus, in comparison with the case where $SiO_2$, SiN, or the like is used for the intermediate layer 17, a change in impedance, or the like due to provision of the intermediate layer 17 is less likely to occur. Thus, good characteristics are stably obtained. This is because differences in density, Young's modulus, and dielectric constant are small between the intermediate layer 17 and the piezoelectric layer 14.

The frequency of the acoustic wave resonator can be adjusted by adjusting the thickness of the piezoelectric layer. Of course, at the time of adjusting the thickness of the piezoelectric layer, when a step portion is provided in the piezoelectric layer, a process, such as milling and etching, is complicated. Furthermore, chipping or the like can occur in the piezoelectric layer. In contrast, in the present preferred embodiment, it is possible to easily adjust the frequency by adjusting the thickness of the intermediate layer 17. Thus, productivity is enhanced.

Figure 20:
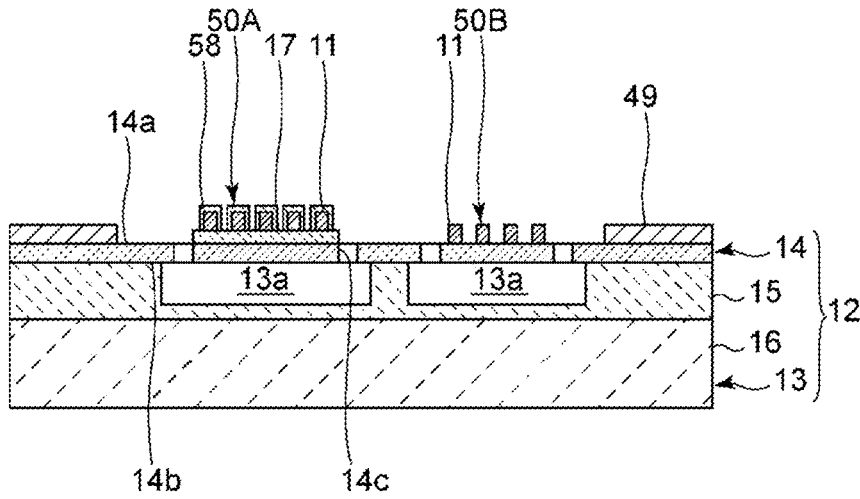
FIG. 20 is a schematic elevational cross-sectional view of a first acoustic wave resonator and a second acoustic wave resonator according to a fifth preferred embodiment of the present invention.

FIG. 20 is a schematic elevational cross-sectional view of a first acoustic wave resonator and a second acoustic wave resonator according to a fifth preferred embodiment of the present invention.

The present preferred embodiment differs from the fourth preferred embodiment in that a non-monocrystal layer 58 is provided on the intermediate layer 17 so as to cover the interdigital transducer electrode 11 of a first acoustic wave resonator 50A. The present preferred embodiment also differs from the fourth preferred embodiment in that a second acoustic wave resonator 50B is not the acoustic wave device according to the present invention. Specifically, the second acoustic wave resonator 50B is not provided with the intermediate layer 17. Other than the above points, the ladder filter according to the present preferred embodiment has a similar configuration to the ladder filter 40 according to the fourth preferred embodiment. The first acoustic wave resonator 50A corresponds to the parallel arm resonator P2 in FIG. 18, and the second acoustic wave resonator 50B corresponds to the series arm resonator S3.

The ladder filter according to the present preferred embodiment includes the first acoustic wave resonator 50A defining and functioning as the acoustic wave device according to the present invention, as in the case of the fourth preferred embodiment. Thus, it is possible to easily adjust the fractional band width of the first acoustic wave resonator 50A, and the element capacitance of the first acoustic wave resonator 50A is difficult to reduce.

The non-monocrystal layer 58 of the first acoustic wave resonator 50A is made of the same material as the piezoelectric layer 14. Thus, the intermediate layer 17 is also made of the same material as the piezoelectric layer 14 and is not a monocrystal layer. Thus, the intermediate layer 17 and the non-monocrystal layer 58 have similar configurations. In the present preferred embodiment, the intermediate layer 17 and the non-monocrystal layer 58 are configured as an integrated non-monocrystal layer. The non-monocrystal layer 58 can be used as a frequency adjusting film. More specifically, it is possible to adjust the frequency of the first acoustic wave resonator 50A by adjusting the thickness of the non-monocrystal layer 58 through trimming.

The second acoustic wave resonator 50B defining and functioning as the series arm resonator has no intermediate layer 17, and the first acoustic wave resonator 50A defining and functioning as the parallel arm resonator has the intermediate layer 17. Thus, it is possible to easily decrease the frequency of the first acoustic wave resonator 50A below the frequency of the second acoustic wave resonator 50B without providing a step portion in the piezoelectric layer 14.

As described above, the intermediate layer 17 can be formed by, for example, sputtering or the like. Before the interdigital transducer electrode 11 is formed, the intermediate layer 17 just needs to be formed on the piezoelectric layer 14. After the interdigital transducer electrode 11 is formed, the non-monocrystal layer 58 just needs to be formed. The non-monocrystal layer 58 can be formed by, for example, sputtering or the like.

A temperature at which the non-monocrystal layer 58 is formed is preferably lower than or equal to about 700° C., more preferably lower than or equal to about 600° C., further preferably lower than or equal to about 500° C., furthermore preferably lower than or equal to about 400° C., and much more preferably lower than or equal to about 300° C., for example. Thus, the non-monocrystal layer 58 is further reliably set to non-piezoelectricity.

The thickness of the non-monocrystal layer 58 is preferably less than or equal to about 150 nm, for example. In this case, the non-monocrystal layer 58 is easily formed, so productivity is enhanced. As in the case of the present preferred embodiment, when the intermediate layer 17 and the non-monocrystal layer 58 are laminated, the thickness of a portion of the non-monocrystal layer 58 on the interdigital transducer electrode 11 is preferably less than or equal to about 150 nm, for example.

The total thickness of the intermediate layer 17 and the non-monocrystal layer 58 at a portion where the intermediate layer 17 and the non-monocrystal layer 58 are laminated is preferably less than or equal to about 150 nm, for example. In this case as well, productivity is enhanced.

The non-monocrystal layer 58 may be provided on the second principal surface 14b of the piezoelectric layer 14. In this way, the non-monocrystal layer 58 may be provided on a principal surface of the piezoelectric layer 14 where the interdigital transducer electrode 11 and intermediate layer 17 of the first acoustic wave resonator 50A are not provided. In this case, the cavity portion 13a of the support member 13 is preferably a through-hole. Thus, the non-monocrystal layer 58 can be suitably used as a frequency adjusting film.

In the first acoustic wave resonator 50A, the intermediate layer 17 may be provided on the second principal surface 14b of the piezoelectric layer 14. The interdigital transducer electrode 11 may be provided indirectly on the second principal surface 14b with the intermediate layer 17 interposed therebetween. In this case, the non-monocrystal layer 58 may be directly provided on the first principal surface 14a of the piezoelectric layer 14.

Here, an effective dielectric constant ε11 of the intermediate layer 17 in an acoustic wave resonator having the configuration of the first acoustic wave resonator 50A shown in FIG. 20 was evaluated. Specifically, evaluations were performed by both fitting of a capacitance curve and fitting of impedance frequency characteristics. Example design parameters of the piezoelectric layer 14 and intermediate layer 17 of the acoustic wave resonator were as follows.

The piezoelectric layer 14 was made of ZYLN with a thickness of 407 nm.

The intermediate layer 17 was made of LN with a thickness of 58 nm.

Figure 21:
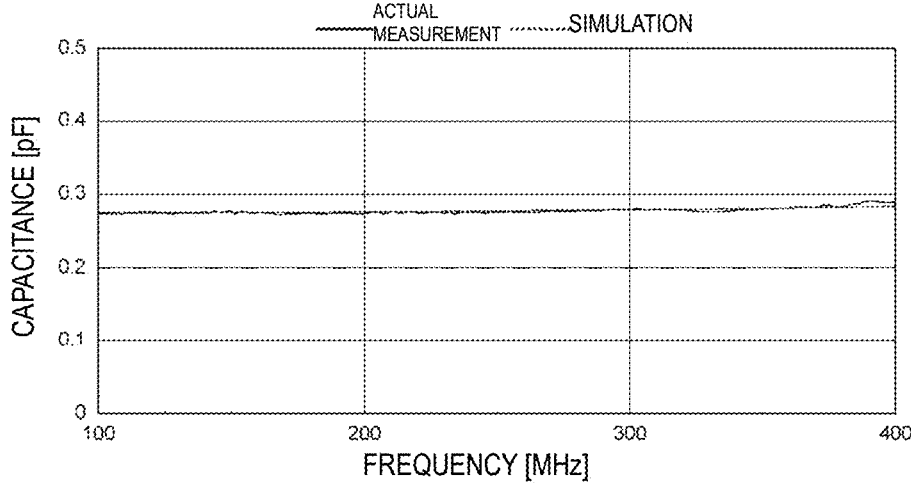
FIG. 21 is a graph that shows capacitance curves, respectively derived by actual measurement and simulation, of an acoustic wave resonator having the configuration of the first acoustic wave resonator according to the fifth preferred embodiment of the present invention.

FIG. 21 is a graph that shows capacitance curves, respectively derived by actual measurement and simulation, of an acoustic wave resonator having the configuration of the first acoustic wave resonator according to the fifth preferred embodiment.

The results of simulation shown in FIG. 21 were specifically results obtained from simulation by setting the dielectric constant ε11 of the intermediate layer 17 to 44. It appears that the results of simulation and the results of actual measurement suitably coincide with each other. Thus, it appears that the effective dielectric constant ε11 of the intermediate layer 17 is about 44 and the dielectric constant ε11 at least falls within the range of greater than or equal to about 40 and less than or equal to about 50, for example.

Figure 22:
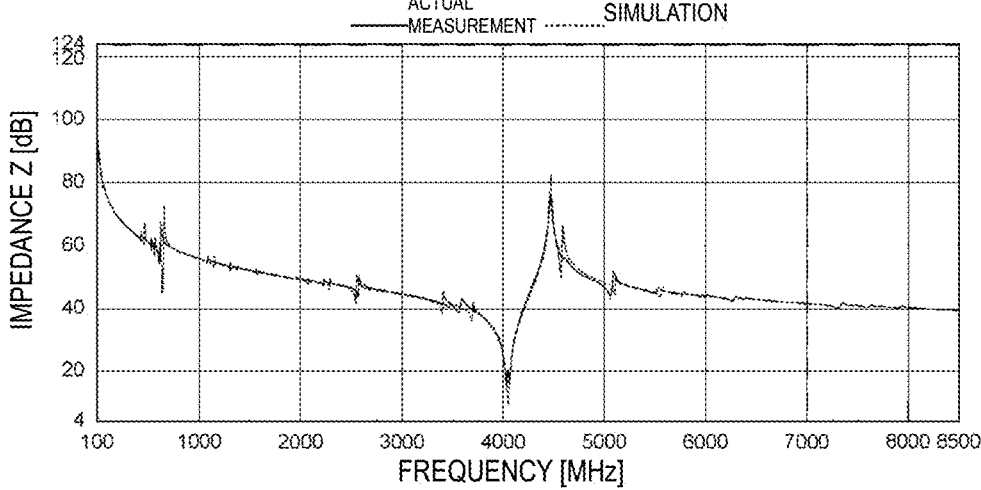
FIG. 22 is a graph that shows impedance frequency characteristics, derived by actual measurement and simulation, of the acoustic wave resonator having the configuration of the first acoustic wave resonator according to the fifth preferred embodiment of the present invention.

FIG. 22 is a graph that shows impedance frequency characteristics, derived by actual measurement and simulation, of the acoustic wave resonator having the configuration of the first acoustic wave resonator according to the fifth preferred embodiment.

The results of simulation shown in FIG. 22 are specifically results obtained from simulation by setting the dielectric constant ε11 of the intermediate layer 17 to 44. As in the case of FIG. 21, in FIG. 22, it appears that the results of simulation and the results of actual measurement suitably coincide with each other. Thus, it appears that the effective dielectric constant ε11 of the intermediate layer 17 is about 44 and the dielectric constant ε11 at least falls within the range of greater than or equal to about 40 and less than or equal to about 50, for example.

In the following description, a first reference example and a second reference example will be described. In each reference example, the intermediate layer 17 is not provided, and the non-monocrystal layer 58 is provided.

Figure 23:
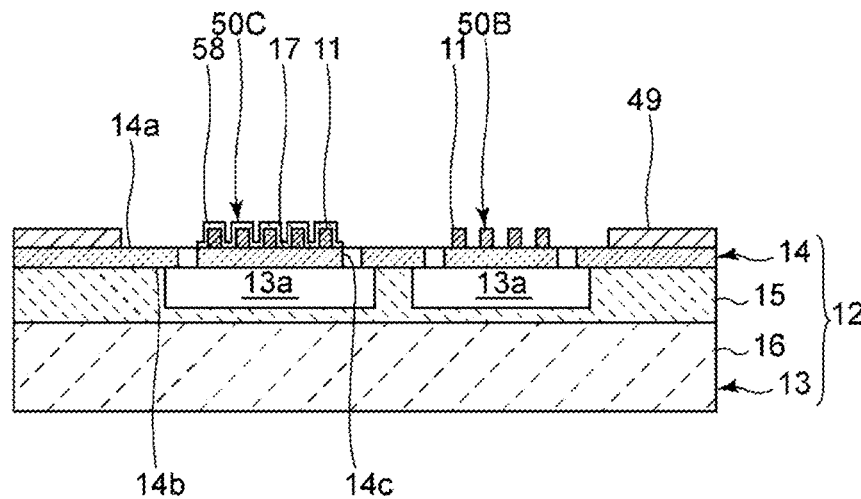
FIG. 23 is a schematic elevational cross-sectional view of a first acoustic wave resonator and a second acoustic wave resonator according to a first reference example.

The first reference example shown in FIG. 23 differs from the fifth preferred embodiment only in that the intermediate layer 17 is not provided. More specifically, the non-monocrystal layer 58 is provided on the first principal surface 14a of the piezoelectric layer 14 so as to cover the interdigital transducer electrode 11 of a first acoustic wave resonator 50C. In the first reference example, as in the case of the fifth preferred embodiment, the non-monocrystal layer 58 can be used as a frequency adjusting film. The piezoelectric layer 14 and the non-monocrystal layer 58 are made of materials of the same type. Thus, a change in impedance, or the like due to provision of the non-monocrystal layer 58 is less likely to occur. Therefore, good characteristics are stably obtained. These advantageous effects are also obtained from the following second reference example.

Figure 24:
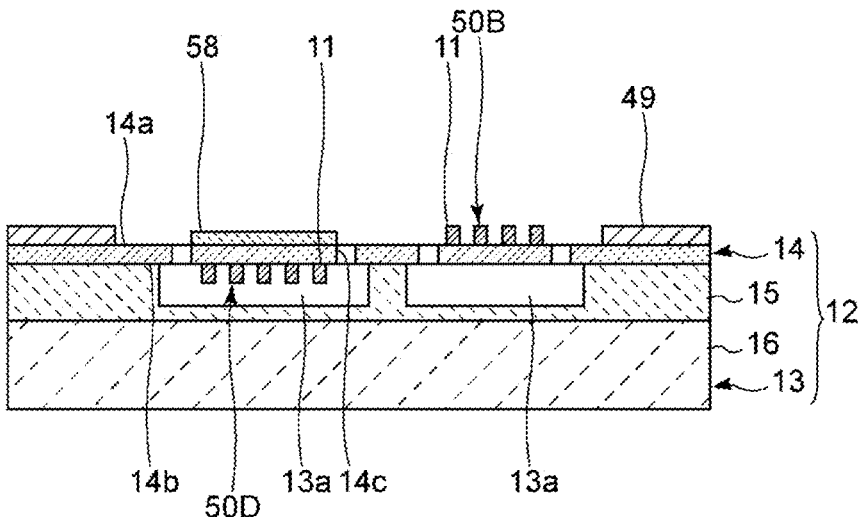
FIG. 24 is a schematic elevational cross-sectional view of a first acoustic wave resonator and a second acoustic wave resonator according to a second reference example.

The second reference example shown in FIG. 24 differs from the first reference example in that the interdigital transducer electrode 11 of a first acoustic wave resonator 50D is provided on the second principal surface 14b of the piezoelectric layer 14. As in the case of the first reference example, the non-monocrystal layer 58 is provided on the first principal surface 14a of the piezoelectric layer 14. In a plan view, the non-monocrystal layer 58 overlaps the interdigital transducer electrode 11.

In the following description, the thickness-shear mode and plate waves will be described in detail. The "electrode" in the following example corresponds to an electrode finger according to a preferred embodiment of the present invention. The support member in the following example corresponds to a support substrate according to a preferred embodiment of the present invention.

Figure 25A:
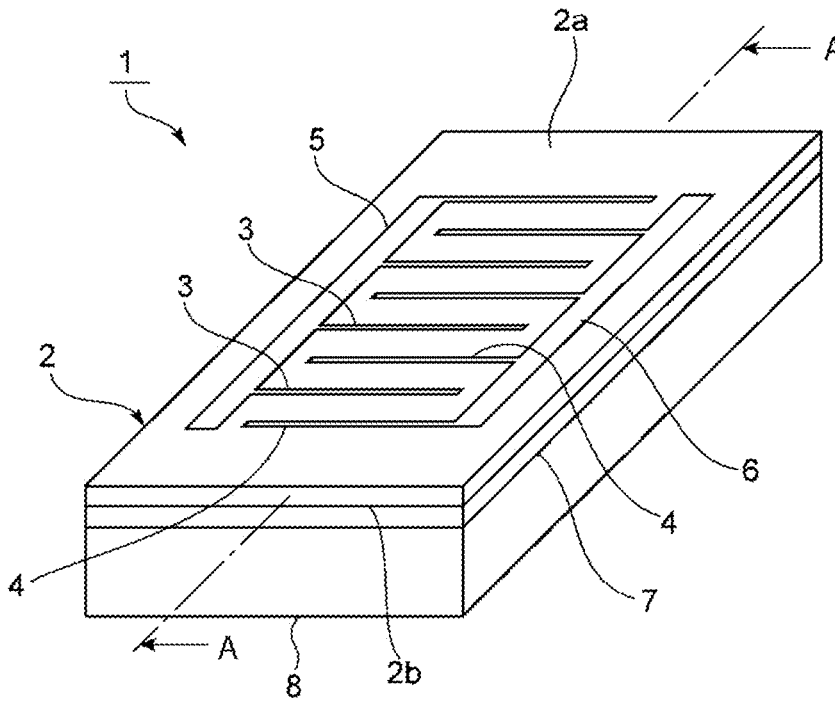
FIG. 25A is a schematic perspective view that shows the external appearance of an acoustic wave device that uses bulk waves in a thickness-shear mode.
Figure 25B:
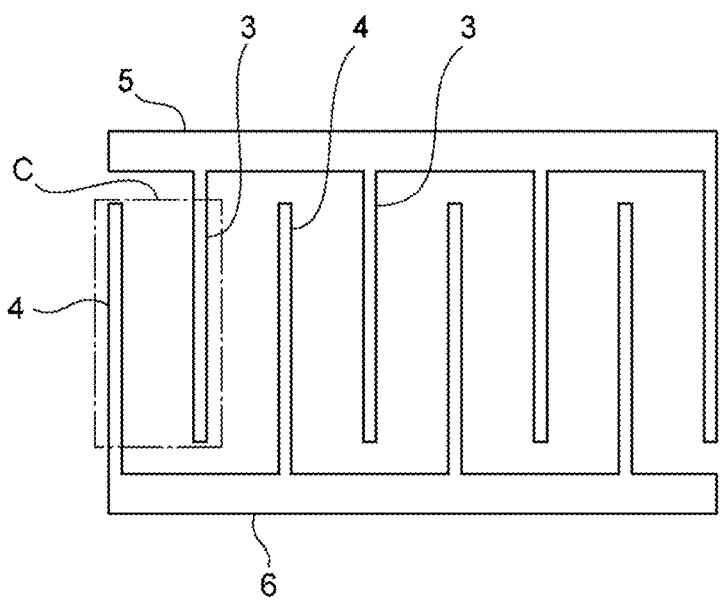
FIG. 25B is a plan view that shows an electrode structure on a piezoelectric layer.
Figure 26:
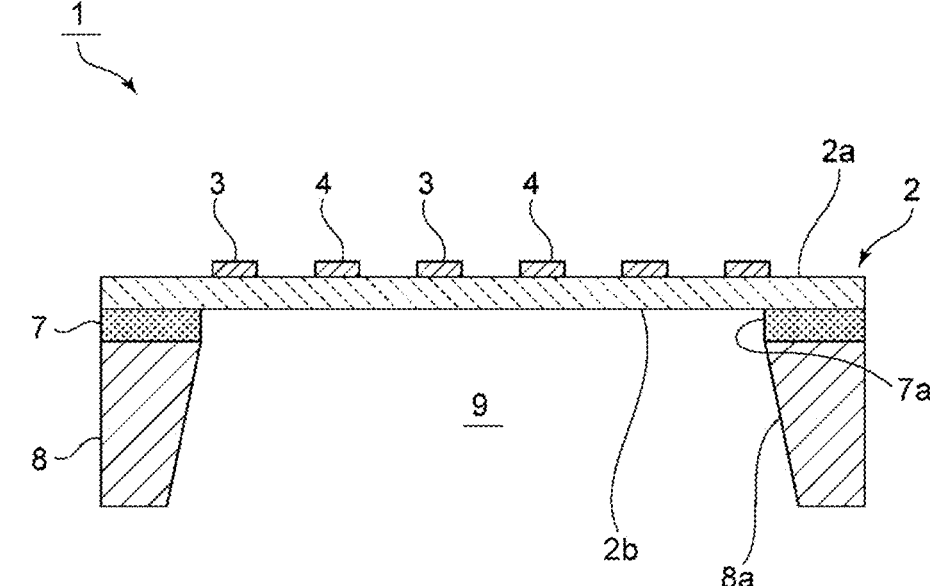
FIG. 26 is a cross-sectional view taken along the line A-A in FIG. 25A.

FIG. 25A is a schematic perspective view that shows the external appearance of an acoustic wave device that uses bulk waves in a thickness-shear mode. FIG. 25B is a plan view that shows an electrode structure on a piezoelectric layer. FIG. 26 is a cross-sectional view taken along the line A-A in FIG. 25A.

An acoustic wave device 1 includes a piezoelectric layer 2 made of $LiNbO_3$. The piezoelectric layer 2 may be made of $LiTaO_3$. The cut angle of $LiNbO_3$ or $LiTaO_3$ is Z-cut in the present preferred embodiment and may be rotated Y-cut or X-cut. The thickness of the piezoelectric layer 2 is not limited and is preferably greater than or equal to about 40 nm and less than or equal to about 1000 nm and more preferably greater than or equal to about 50 nm and less than or equal to about 1000 nm to effectively excite a thickness-shear mode, for example. The piezoelectric layer 2 includes opposed first and second principal surfaces 2a, 2b. Electrodes 3 and electrodes 4 are provided on the first principal surface 2a. Here, the electrodes 3 are examples of the "first electrode", and the electrodes 4 are examples of the "second electrode". In FIGS. 25A and 25B, the plurality of electrodes 3 is connected to a first busbar 5. The plurality of electrodes 4 is connected to a second busbar 6. The plurality of electrodes 3 and the plurality of electrodes 4 interdigitate with each other. The electrodes 3 and the electrodes 4 each have a rectangular shape and have a length direction. In a direction orthogonal to the length direction, each of the electrodes 3 and an adjacent one of the electrodes 4 are opposed to each other. The length direction of the electrodes 3, 4 and the direction orthogonal to the length direction of the electrodes 3, 4 both are directions that intersect with a thickness direction of the piezoelectric layer 2. For this reason, each of the electrodes 3 and an adjacent one of the electrodes 4 may be regarded as being opposed to each other in the direction that intersects with the thickness direction of the piezoelectric layer 2. Alternatively, the length direction of the electrodes 3, 4 may be interchanged with the direction orthogonal to the length direction of the electrodes 3, 4, shown in FIGS. 25A and 25B. In other words, in FIGS. 25A and 25B, the electrodes 3, 4 may be extended in a direction in which the first busbar 5 and the second busbar 6 extend. In this case, the first busbar 5 and the second busbar 6 extend in the direction in which the electrodes 3, 4 extend in FIGS. 25A and 25B. A plurality of pairs of electrodes 3, 4, in each pair of which the electrode 3 connected to one potential and the electrode 4 connected to the other potential are adjacent to each other, is provided in the direction orthogonal to the length direction of the electrodes 3, 4. Here, a state where the electrode 3 and the electrode 4 are adjacent to each other does not mean a case where the electrode 3 and the electrode 4 are disposed so as to be in direct contact with each other and means a case where the electrode 3 and the electrode 4 are disposed with a gap therebetween. When the electrode 3 and the electrode 4 are adjacent to each other, no electrode connected to a hot electrode or a ground electrode, including the other electrodes 3, 4, is disposed between the electrode 3 and the electrode 4. The number of the pairs is not necessarily an integer number of pairs and may be 1.5 pairs, 2.5 pairs, or the like. A center-to-center distance between the electrodes 3, 4, that is, pitch, preferably falls within the range of greater than or equal to about 1 μm and less than or equal to about 10 μm, for example. The width of each of the electrodes 3, 4, that is, the dimension of each of the electrodes 3, 4 in the opposed direction, preferably falls within the range of greater than or equal to about 50 nm and less than or equal to about 1000 nm and more preferably falls within the range of greater than or equal to about 150 nm and less than or equal to about 1000 nm, for example. The center-to-center distance between the electrodes 3, 4 is the distance between the center of the dimension (width dimension) of the electrode 3 in the direction orthogonal to the length direction of the electrode 3 and the center of the dimension (width dimension) of the electrode 4 in the direction orthogonal to the length direction of the electrode 4.

In the acoustic wave device 1, since the Z-cut piezoelectric layer is used, the direction orthogonal to the length direction of the electrodes 3, 4 is a direction orthogonal to a polarization direction of the piezoelectric layer 2. When a piezoelectric body with another cut angle is used as the piezoelectric layer 2, this does not apply. Here, the term "orthogonal" is not limited only to a strictly orthogonal case and may be substantially orthogonal (an angle formed between the direction orthogonal to the length direction of the electrodes 3, 4 and the polarization direction, for example, falls within the range of about 90°±10°.

A support member 8 is laminated to the second principal surface 2b of the piezoelectric layer 2 with an electrically insulating layer 7 interposed therebetween. As shown in FIG. 26, the electrically insulating layer 7 has a frame shape and has a through-hole 7a, and the support member 8 has a frame shape and has a through-hole 8a. With this configuration, a cavity portion 9 is formed. The cavity portion 9 is provided so as not to impede vibrations of excitation regions C of the piezoelectric layer 2. Therefore, the support member 8 is laminated to the second principal surface 2b with the electrically insulating layer 7 interposed therebetween at a location that does not overlap a part where at least one pair of electrodes 3, 4 is provided. The electrically insulating layer 7 does not need to be provided. Therefore, the support member 8 can be laminated directly or indirectly on the second principal surface 2b of the piezoelectric layer 2.

The electrically insulating layer 7 is made of silicon oxide. Other than silicon oxide, an appropriate electrically insulating material, such as silicon oxynitride and alumina, may be used. The support member 8 is made of Si. A plane direction of a piezoelectric layer 2-side surface of Si may be (100) or (110) or may be (111). Si that is a component of the support member 8 preferably has a high resistance with a resistivity of higher than or equal to about 4 kΩcm, for example. The support member 8 may also be made of an appropriate electrically insulating material or an appropriate semiconductor material.

Examples of the material of the support member 8 include a piezoelectric body, such as aluminum oxide, lithium tantalate, lithium niobate, and quartz crystal, various ceramics, such as alumina, magnesia, sapphire, silicon nitride, aluminum nitride, silicon carbide, zirconia, cordierite, mullite, steatite, and forsterite, a dielectric, such as diamond and glass, and a semiconductor, such as gallium nitride.

The plurality of electrodes 3, 4 and the first and second busbars 5, 6 are made of an appropriate metal or alloy, such as Al and AlCu alloy. In the present preferred embodiment, the electrodes 3, 4 and the first and second busbars 5, 6 have a structure such that an Al film is laminated on a Ti film. An adhesion layer other than a Ti film may be used.

At the time of driving, an alternating-current voltage is applied between the plurality of electrodes 3 and the plurality of electrodes 4. More specifically, an alternating-current voltage is applied between the first busbar 5 and the second busbar 6. With this configuration, resonant characteristics that use bulk waves in the thickness-shear mode, which are excited in the piezoelectric layer 2, can be obtained. In the acoustic wave device 1, when the thickness of the piezoelectric layer 2 is d and the center-to-center distance between any adjacent electrodes 3, 4 of the plurality of pairs of electrodes 3, 4 is p, d/p is less than or equal to about 0.5, for example. For this reason, bulk waves in the thickness-shear mode are effectively excited, so good resonant characteristics are obtained. More preferably, d/p is less than or equal to about 0.24, for example, and, in this case, further good resonant characteristics are obtained.

Since the acoustic wave device 1 has the above configuration, the quality factor is unlikely to decrease even when the number of pairs of the electrodes 3, 4 is reduced for the purpose of reducing the size. This is because a propagation loss is small even when the number of electrode fingers in a reflector at each side is reduced. The reason why the number of the electrode fingers can be reduced is because bulk waves in the thickness-shear mode are used. The difference between Lamb waves used in the acoustic wave device and bulk waves in the thickness-shear mode will be described with reference to FIGS. 27A and 27B.

Figure 27A:
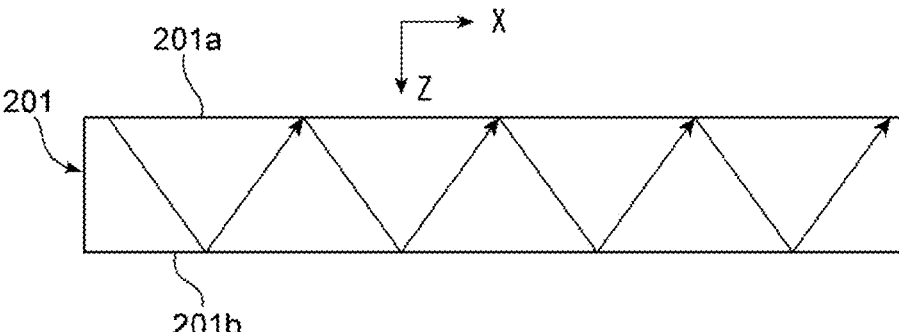
FIG. 27A is a schematic elevational cross-sectional view for illustrating Lamb waves that propagate in a piezoelectric film of the acoustic wave device.

FIG. 27A is a schematic elevational cross-sectional view for illustrating a Lamb wave propagating in a piezoelectric film of an acoustic wave device as described in Japanese Unexamined Patent Application Publication No. 2012-257019. Here, the waves propagate in a piezoelectric film 201 as indicated by the arrows. Here, in the piezoelectric film 201, a first principal surface 201a and a second principal surface 201b are opposed to each other, and a thickness direction connecting the first principal surface 201a and the second principal surface 201b is a Z direction. An X direction is a direction in which electrode fingers of an interdigital transducer electrode are arranged. As shown in FIG. 27A, for Lamb waves, the waves propagate in the X direction as shown in the drawing. The waves are plate waves, so the piezoelectric film 201 vibrates as a whole. However, the waves propagate in the X direction. Therefore, resonant characteristics are obtained by arranging a reflector on each side. For this reason, a wave propagation loss occurs, and the quality factor decreases when the size is reduced, that is, when the number of pairs of electrode fingers is reduced.

Figure 27B:
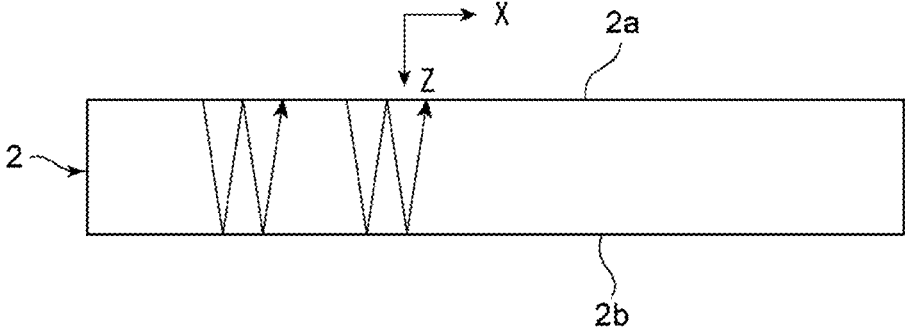
FIG. 27B is a schematic elevational cross-sectional view for illustrating bulk waves in the thickness-shear mode, which propagate in the piezoelectric film in the acoustic wave device.

In contrast, as shown in FIG. 27B, in the acoustic wave device 1, a vibration displacement is caused in the thickness-shear direction, so the waves propagate substantially in the direction connecting the first principal surface 2a and the second principal surface 2b of the piezoelectric layer 2, that is, the Z direction, and resonate. In other words, the X-direction components of the waves are significantly smaller than the Z-direction components. Since the resonant characteristics are obtained from the propagation of the waves in the Z direction, a propagation loss is difficult to occur even when the number of electrode fingers of each of the reflectors is reduced. In addition, even when the number of pairs of electrodes including the electrodes 3, 4 is reduced to reduce the size, the quality factor is unlikely to decrease.

Figure 28:
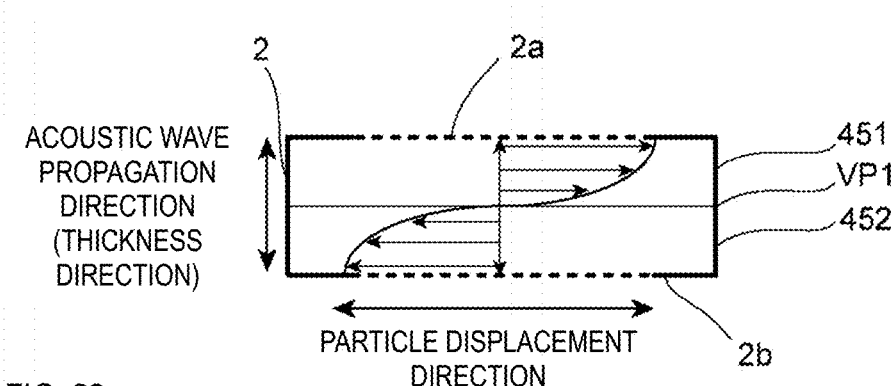
FIG. 28 is a view that shows an amplitude direction of bulk waves in the thickness-shear mode.

As shown in FIG. 28, the amplitude direction of the bulk waves in the thickness-shear mode is opposite between a first region 451 included in the excitation region C of the piezoelectric layer 2 and a second region 452 included in the excitation region C. FIG. 28 schematically shows bulk waves when a voltage with which the electrodes 4 are higher in potential than the electrodes 3 is applied between the electrodes 3 and the electrodes 4. The first region 451 is a region in the excitation region C between the first principal surface 2a and an imaginary plane VP1 that is orthogonal to the thickness direction of the piezoelectric layer 2 and that divides the piezoelectric layer 2 into two. The second region 452 is a region in the excitation region C between the imaginary plane VP1 and the second principal surface 2b.

As described above, in the acoustic wave device 1, at least one pair of electrodes including the electrode 3 and the electrode 4 is provided. However, the waves are not caused to propagate in the X direction, so the number of pairs of electrodes including the electrodes 3, 4 does not need to be multiple. In other words, at least one pair of electrodes just needs to be provided.

For example, the electrode 3 is an electrode connected to a hot potential, and the electrode 4 is an electrode connected to a ground potential. The electrode 3 may be connected to a ground potential, and the electrode 4 may be connected to a hot potential. In the present preferred embodiment, each of the at least one pair of electrodes is an electrode connected to a hot potential or an electrode connected to a ground potential as described above, and no floating electrode is provided.

Figure 29:
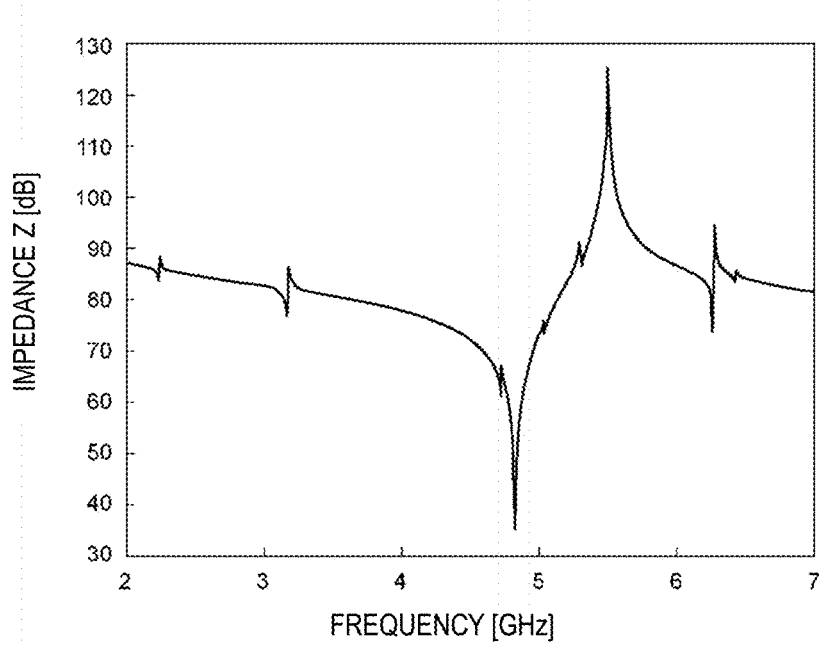
FIG. 29 is the resonant characteristics of an acoustic wave device that uses bulk waves in the thickness-shear mode.

FIG. 29 is a graph that shows the resonant characteristics of the acoustic wave device shown in FIG. 26. Examples of the design parameters of the acoustic wave device 1 having the resonant characteristics were as follows.

The piezoelectric layer 2 was made of $LiNbO_3$ with Euler angles of (0°, 0°, 90°) and has a thickness of 400 nm.

When viewed in a direction orthogonal to the length direction of the electrodes 3 and the electrodes 4, the length of a region in which the electrodes 3 and the electrodes 4 overlapped, that is, the excitation region C, was 40 μm, the number of pairs of electrodes including the electrodes 3, 4 was 21, the center-to-center distance between the electrodes was 3 μm, the width of each of the electrodes 3, 4 was 500 nm, and d/p was 0.133.

The electrically insulating layer 7 was made of a silicon oxide film having a thickness of 1 μm.

The support member 8 was made of Si.

The length of the excitation region C is the dimension of the excitation region C along the length direction of the electrodes 3, 4.

In the present preferred embodiment, the distance between any adjacent electrodes of the pairs of electrodes including the electrodes 3, 4 is equal among all the plurality of pairs. In other words, the electrodes 3 and the electrodes 4 are disposed at a constant pitch.

As is apparent from FIG. 29, although no reflectors are provided, good resonant characteristics with a fractional band width of about 12.5% are obtained, for example.

Incidentally, when the thickness of the piezoelectric layer 2 is d and the center-to-center distance between the electrodes of the electrodes 3 and the electrodes 4 is p, d/p is, for example, less than or equal to about 0.5 and preferably less than or equal to about 0.24 in the present preferred embodiment as described above. This will be described with reference to FIG. 30.

Figure 30:
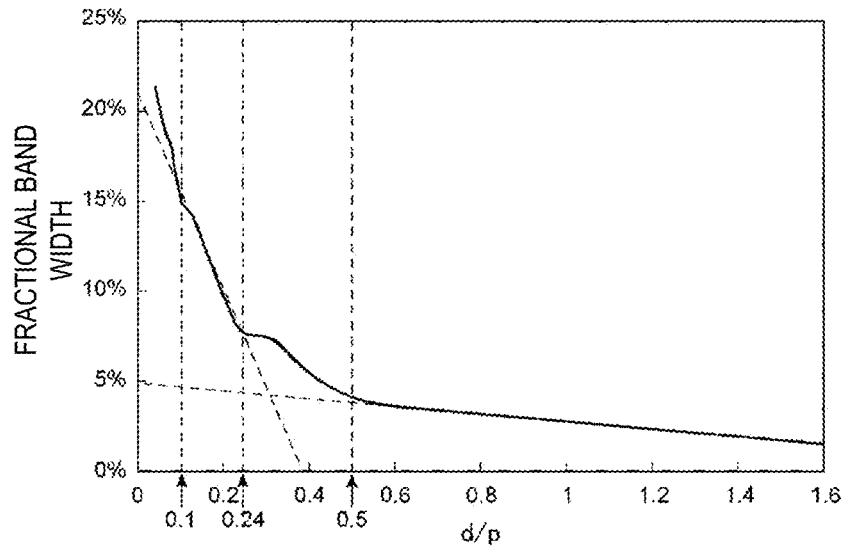
FIG. 30 is a graph that shows the relationship between d/p and the fractional band width of a resonator where the center-to-center distance between adjacent electrodes is p and the thickness of the piezoelectric layer is d.

A plurality of acoustic wave devices is obtained while d/p is changed as in the case of the acoustic wave device having the resonant characteristics shown in FIG. 29. FIG. 30 is a graph that shows the relationship between d/p and the fractional band width of the acoustic wave device as a resonator.

As is apparent from FIG. 30, when d/p>about 0.5, the fractional band width is lower than about 5% even when d/p is adjusted, for example. In contrast, in the case where d/p about 0.5, when d/p is changed within this range, the fractional band width can be set to about 5% or higher, for example, that is, a resonator having a high coupling coefficient is provided. In the case where d/p is lower than or equal to about 0.24, the fractional band width can be increased to about 7% or higher, for example. In addition, when d/p is adjusted within this range, a resonator having a further wide fractional band width is obtained, so a resonator having a further high coupling coefficient is achieved. Therefore, it was discovered and confirmed that, when d/p is set to about 0.5 or less, a resonator that uses bulk waves in the thickness-shear mode with a high coupling coefficient can be provided.

Figure 31:
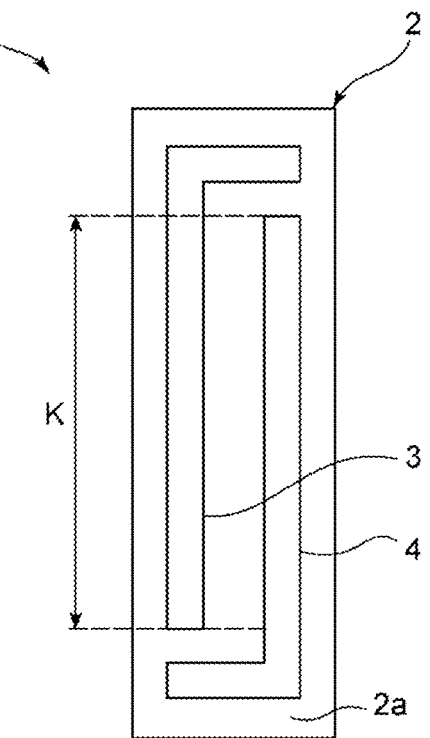
FIG. 31 is a plan view of an acoustic wave device that uses bulk waves in the thickness-shear mode.

FIG. 31 is a plan view of an acoustic wave device that uses bulk waves in the thickness-shear mode. In an acoustic wave device 80, one pair of electrodes having the electrode 3 and the electrode 4 is provided on the first principal surface 2a of the piezoelectric layer 2. In FIG. 31, K is an overlap width. As described above, in an acoustic wave device according to a preferred embodiment of the present invention, the number of pairs of electrodes may be one, for example. In this case as well, when d/p is less than or equal to about 0.5, for example, bulk waves in the thickness-shear mode can be effectively excited.

Figure 32:
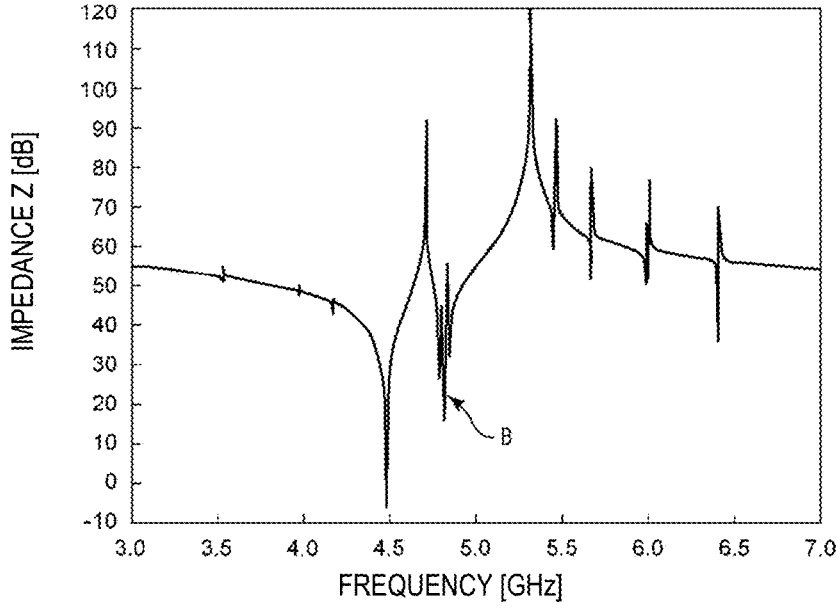
FIG. 32 is a graph of the resonant characteristics of an acoustic wave device according to a reference example in which spurious is appearing.

In the acoustic wave device 1, preferably, in the plurality of electrodes 3, 4, it is desirable that a metallization ratio MR of any adjacent electrodes 3, 4 to the excitation region C that is a region in which the any adjacent electrodes 3, 4 overlap when viewed in a direction in which the any adjacent electrodes 3, 4 are opposed to each other satisfy MR≤about 1.75(d/p)+0.075, for example. In this case, spurious is effectively reduced. This will be described with reference to FIGS. 32 and 33. FIG. 32 is a reference graph of an example of the resonant characteristics of the acoustic wave device 1. The spurious indicated by the arrow B appears between a resonant frequency and an anti-resonant frequency. Here, d/p was set to about 0.08, and the Euler angles of LiNbO₃ were set to (0°, 0°, 90°), for example. The metallization ratio MR was set to about 0.35, for example.

The metallization ratio MR will be described with reference to FIG. 25B. In the electrode structure of FIG. 25B, when focusing on one pair of electrodes 3, 4, it is assumed that only the one pair of electrodes 3, 4 is provided. In this case, the portion surrounded by the alternate long and short dashed line is an excitation region C. The excitation region C includes, when the electrode 3 and the electrode 4 are viewed in the direction orthogonal to the length direction of the electrodes 3, 4, that is, the opposed direction, a region of the electrode 3, overlapping the electrode 4, a region of the electrode 4, overlapping the electrode 3, and a region in which the electrode 3 and the electrode 4 overlap in a region between the electrode 3 and the electrode 4. Then, the area of the electrodes 3, 4 in the excitation region C to the area of the excitation region C is a metallization ratio MR. In other words, the metallization ratio MR is the ratio of the area of a metallization portion to the area of the excitation region C.

When a plurality of pairs of electrodes is provided, the ratio of a metallization portion included in the total excitation region to the total area of the excitation region just needs to be set for MR.

Figure 33:
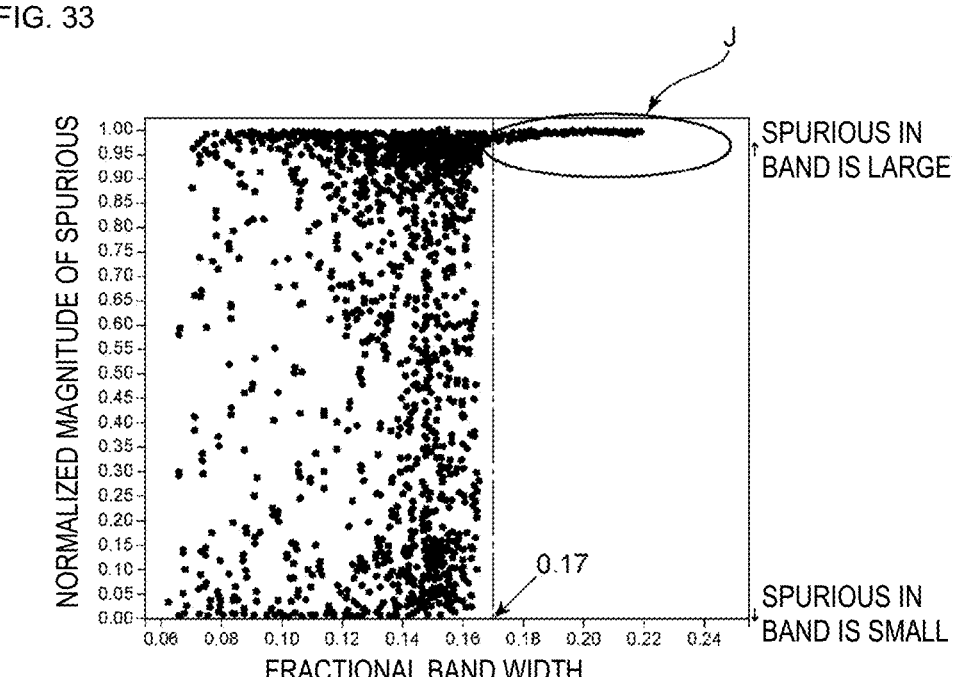
FIG. 33 is a graph of the relationship between a fractional band width and a phase rotation amount of impedance of spurious normalized by 180 degrees as the magnitude of spurious.

FIG. 33 is a graph of the relationship between a fractional band width in the case where a large number of acoustic wave resonators are provided and a phase rotation amount of impedance of spurious normalized by 180 degrees as the magnitude of spurious in accordance with the present preferred embodiment. For a fractional band width, the film thickness of the piezoelectric layer and the dimensions of the electrodes were variously changed and adjusted. FIG. 33 is a result in the case where the piezoelectric layer made of Z-cut LiNbO₃ is used, and similar tendency is obtained when a piezoelectric layer with another cut angle is used as well.

In a region surrounded by the ellipse J in FIG. 33, the spurious is about 1.0 and large, for example. As is apparent from FIG. 33, when the fractional band width exceeds about 0.17, that is, about 17%, for example, large spurious having a spurious level of greater than or equal to one appears in a pass band even when parameters composing the fractional band width are changed. In other words, as in the case of the resonant characteristics shown in FIG. 32, large spurious indicated by the arrow B appears in the band. Thus, the fractional band width is preferably lower than or equal to about 17%, for example. In this case, spurious can be reduced by adjusting the film thickness of the piezoelectric layer 2, the dimensions of the electrodes 3, 4, and the like.

Figure 34:
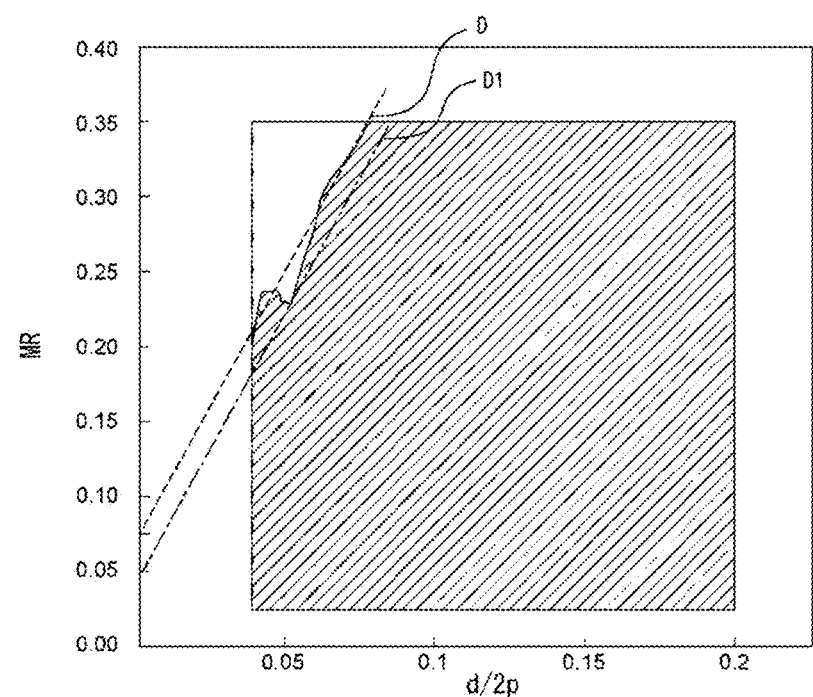
FIG. 34 is a graph that shows the relationship between d/2p and metallization ratio MR.

FIG. 34 is a graph of the relationship among d/2p, metallization ratio MR, and fractional band width. In the above-described acoustic wave device, various acoustic wave devices of which d/2p and MR were different were provided, and the fractional band widths were measured. The hatched portion to the right-hand side of the dashed line D in FIG. 34 is a region in which the fractional band width is lower than or equal to about 17%, for example. A boundary between the hatched region and a non-hatched region is expressed by MR=about 3.5 (d/2p)+0.075, for example. In other words, MR=about 1.75(d/p)+0.075, for example. Therefore, preferably, MR≤about 1.75(d/p)+0.075, for example. In this case, the fractional band width is easily set to about 17% or lower, for example. More preferabl y, this is the region to the right-hand side of MR=about 3.5 (d/2p)+0.05, for example, as indicated by the alternate long and short dashed line D1 in FIG. 34. In other words, when MR≤about 1.75(d/p)+0.05, the fractional band width is reliably set to about 17% or lower, for example.

Figure 35:
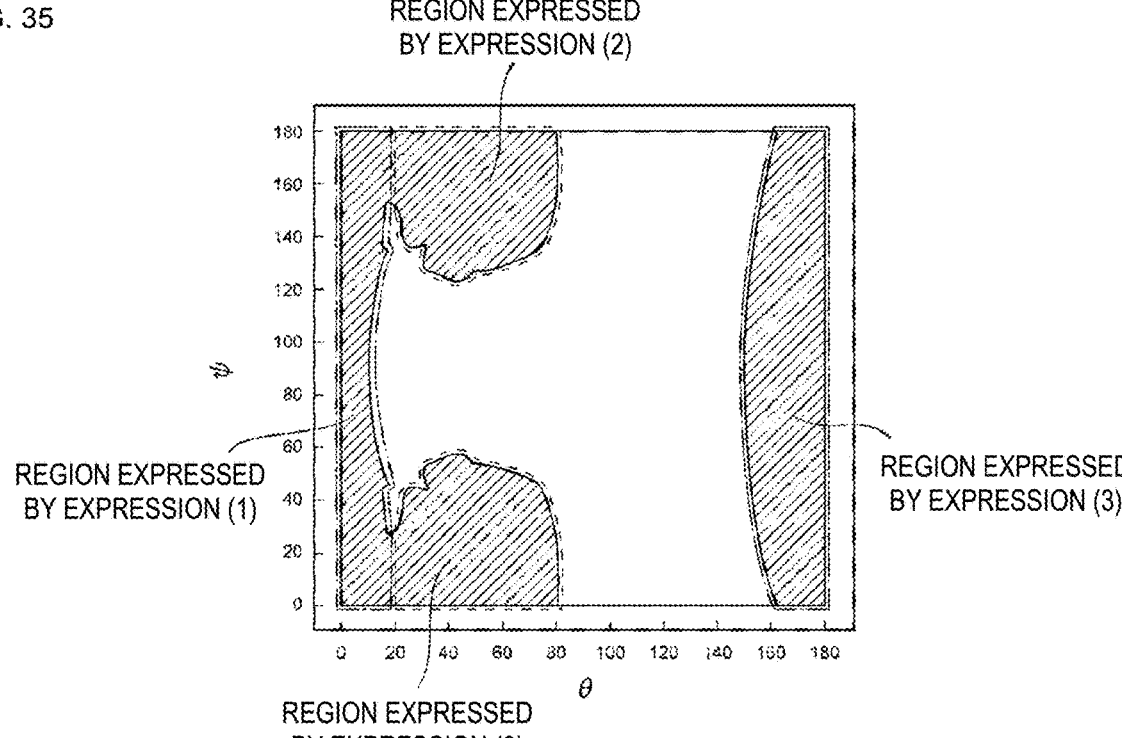
FIG. 35 is a diagram of a map of a fractional band width for the Euler angles (0°, θ, ψ) of LiNbO₃ when d/p is brought close to zero without limit.

FIG. 35 is a diagram of a map of a fractional band width for the Euler angles (0°, θ, ψ) of LiNbO₃ when d/p is brought close to zero without limit. The hatched portion in FIG. 35 is a region in which a fractional band width of at least about 5% or higher is obtained, for example, and, when the range of the region is approximated, the range is expressed by the following expression (1), expression (2), and expression (3).

$$(0° \pm 10°, 0° \text{ to } 20°, \text{any } \psi) \qquad (1)$$

$$(0° \pm 10°, 20° \text{ to } 80°, 0° \text{ to } 60° (1-(θ-50)^2/900)^{1/2)} \text{ or}$$
$$(0° \pm 10°, 20° \text{ to } 80°, [180°-60° (1-(θ-50)^2/900)^{1/2}] \text{ to } 180°) \qquad (2)$$

$$(0°\pm10°,[180°-30° \ (1-(\psi-90)^2/8100)^{1/2}] \text{ to } 180°, \text{any}$$
$$\psi) \qquad\qquad (3)$$

Therefore, in the case of the range of Euler angles of the above expression (1), expression (2), or expression (3), the fractional band width is sufficiently widened, and it is preferable. This also applies to the case where the piezoelectric layer 2 is a lithium tantalate layer.

Figure 36:
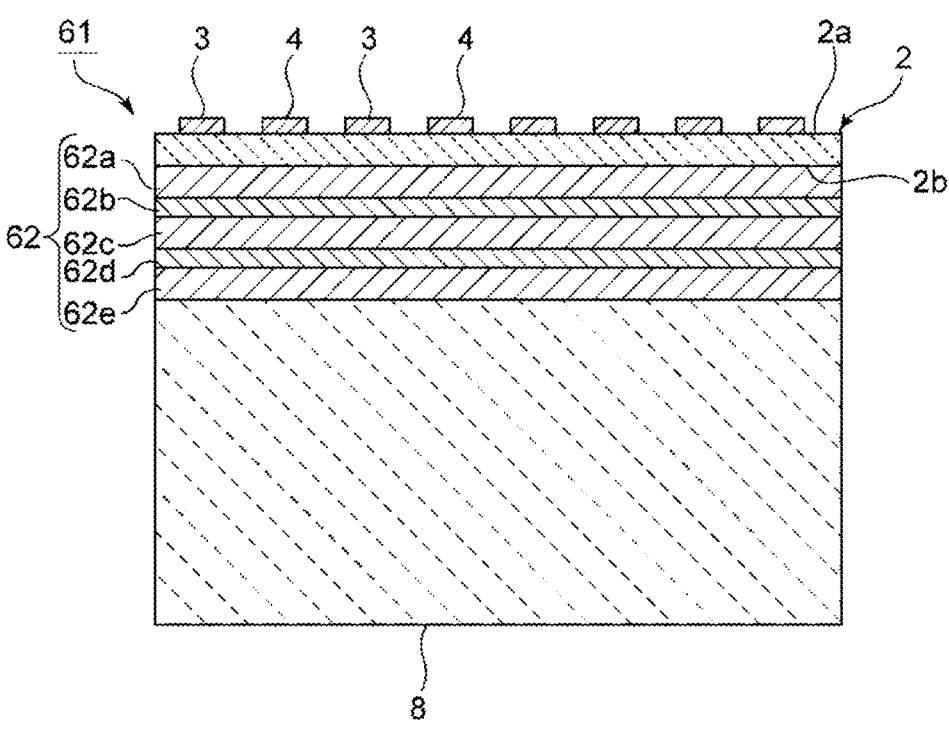
FIG. 36 is an elevational cross-sectional view of an acoustic wave device having an acoustic multilayer film.

FIG. 36 is an elevational cross-sectional view of an acoustic wave device having an acoustic multilayer film. In an acoustic wave device 61, an acoustic multilayer film 62 is laminated on the second principal surface 2b of the piezoelectric layer 2. The acoustic multilayer film 62 includes a multilayer structure of low acoustic impedance layers 62a, 62c, 62e having a relatively low acoustic impedance and high acoustic impedance layers 62b, 62d having a relatively high acoustic impedance. When the acoustic multilayer film 62 is used, bulk waves in the thickness-shear mode can be trapped in the piezoelectric layer 2 without using the cavity portion 9 in the acoustic wave device 1. In this acoustic wave device 61 as well, resonant characteristics based on bulk waves in the thickness-shear mode can be obtained by setting d/p to about 0.5 or less, for example. In the acoustic multilayer film 62, the number of the laminated low acoustic impedance layers 62a, 62c, 62e and the number of the laminated high acoustic impedance layers 62b, 62d are not limited. At least one of the high acoustic impedance layers 62b, 62d just needs to be disposed on the side farther from the piezoelectric layer 2 than the low acoustic impedance layers 62a, 62c, 62e.

The low acoustic impedance layers 62a, 62c, 62e and the high acoustic impedance layers 62b, 62d may be made of a material selected as needed as long as the relationship among the acoustic impedance layers is satisfied. Examples of the material of the low acoustic impedance layers 62a, 62c, 62e may include silicon oxide and silicon oxynitride. Examples of the material of the high acoustic impedance layers 62b, 62d may include alumina, silicon nitride, and metals.

Figure 37:
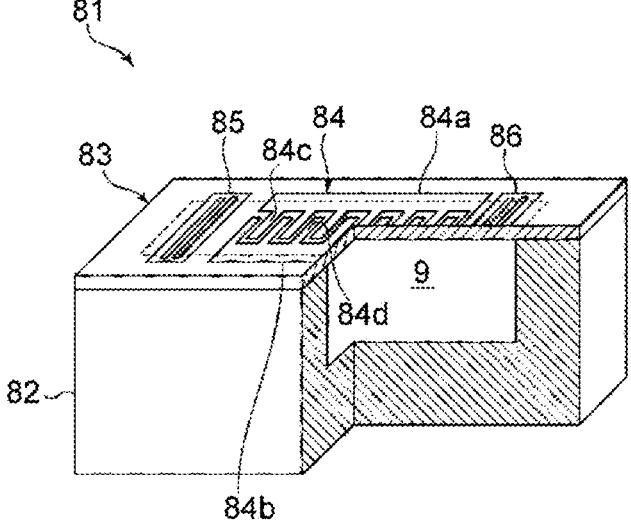
FIG. 37 is a partially cutaway perspective view for illustrating an acoustic wave device that uses Lamb waves.

FIG. 37 is a partially cutaway perspective view for illustrating an acoustic wave device that uses Lamb waves.

The acoustic wave device 81 includes a support substrate 82. The support substrate 82 includes a recessed portion open at an upper surface. A piezoelectric layer 83 is laminated on the support substrate 82. Thus, the cavity portion 9 is formed. An interdigital transducer electrode 84 is provided on the piezoelectric layer 83 above the cavity portion 9. Reflectors 85, 86 are respectively provided on both sides of the interdigital transducer electrode 84 in an acoustic wave propagation direction. In FIG. 37, the outer periphery of the cavity portion 9 is indicated by dashed line. Here, the interdigital transducer electrode 84 includes first and second busbars 84a, 84b, a plurality of first electrode fingers 84c, and a plurality of second electrode fingers 84d. The plurality of first electrode fingers 84c is connected to the first busbar 84a. The plurality of second electrode fingers 84d is connected to the second busbar 84b. The plurality of first electrode fingers 84c and the plurality of second electrode fingers 84d interdigitate with each other.

In the acoustic wave device 81, Lamb waves defining and functioning as plate waves are excited when an alternating-current electric field is applied to the interdigital transducer electrode 84 above the cavity portion 9. Since the reflectors 85, 86 are respectively provided on both sides, resonant characteristics based on the Lamb waves are obtained.

In this way, the acoustic wave resonator that is an acoustic wave device according to a preferred embodiment of the present invention may be configured to use plate waves. In this case, the interdigital transducer electrode 84, the reflector 85, and the reflector 86 shown in FIG. 37 just need to be provided on the piezoelectric layer of the acoustic wave resonator according to the first preferred embodiment, the second preferred embodiment, the fourth preferred embodiment, the fifth preferred embodiment, or any one of the modifications.

In the acoustic wave resonator according to the first preferred embodiment, the second preferred embodiment, the fourth preferred embodiment, the fifth preferred embodiment, or any one of the modifications, which uses bulk waves in a thickness-shear mode, an acoustic multilayer film may be provided. For example, the acoustic multilayer film 62 shown in FIG. 36 may be provided between the support substrate 16 and the piezoelectric layer 14 shown in FIG. 1 or the like.

In the acoustic wave resonator according to the first preferred embodiment, the second preferred embodiment, the fourth preferred embodiment, the fifth preferred embodiment, or any one of the modifications, which uses bulk waves in a thickness-shear mode, as described above, d/p is preferably less than or equal to 0.5 and more preferably less than or equal to about 0.24, for example. Thus, further good resonant characteristics are obtained. Furthermore, in the acoustic wave resonator according to the first preferred embodiment, the second preferred embodiment, the fourth preferred embodiment, the fifth preferred embodiment, or any one of the modifications, which uses bulk waves in a thickness-shear mode, as described above, MR≤about 1.75 (d/p)+0.075 is preferably satisfied, for example. In this case, the spurious can be further reliably suppressed.

The piezoelectric layer in the acoustic wave resonator according to the first preferred embodiment, the second preferred embodiment, the fourth preferred embodiment, the fifth preferred embodiment, or any one of the modifications, which uses bulk waves in a thickness-shear mode, is preferably a lithium niobate layer or a lithium tantalate layer. Euler angles ($\varphi$, $\theta$, $\psi$) of lithium niobate or lithium tantalate that is a component of the piezoelectric layer preferably fall within the range of the above-described expression (1), expression (2), or expression (3). In this case, a fractional band width is sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric board including a piezoelectric layer with a first principal surface and a second principal surface opposed to each other;
   an intermediate layer on the first principal surface or the second principal surface of the piezoelectric layer; and
   a functional electrode on the intermediate layer; wherein
   a material of the intermediate layer is a same type as a material of the piezoelectric layer, and an electromechanical coupling coefficient of the intermediate layer is smaller than an electromechanical coupling coefficient of the piezoelectric layer; and
   where a dielectric constant of the piezoelectric layer is $\varepsilon a$ and a dielectric constant of the intermediate layer is $\varepsilon b$, about $0.9\varepsilon a \le \varepsilon b \le$ about $1.1\varepsilon a$.

2. The acoustic wave device according to claim 1, wherein the intermediate layer is a non-monocrystal layer, and the piezoelectric layer is a monocrystal layer.

3. The acoustic wave device according to claim 1, wherein the intermediate layer is not piezoelectric.

4. The acoustic wave device according to claim 1, wherein the piezoelectric board is a piezoelectric substrate including only the piezoelectric layer.

5. The acoustic wave device according to claim 1, wherein the piezoelectric layer is a lithium tantalate layer or a lithium niobate layer.

6. A ladder filter comprising:

a plurality of acoustic wave resonators including at least one series arm resonator and at least one parallel arm resonator; wherein at least one of the plurality of acoustic wave resonators is the acoustic wave device according to claim 1.

7. The ladder filter according to claim 6, wherein the plurality of acoustic wave resonators includes a first acoustic wave resonator and a second acoustic wave resonator each defined by the acoustic wave device; and a thickness of the intermediate layer of the first acoustic wave resonator and a thickness of the intermediate layer of the second acoustic wave resonator are different from each other.

8. The ladder filter according to claim 7, wherein the first acoustic wave resonator is the parallel arm resonator, and the second acoustic wave resonator is the series arm resonator; and the thickness of the intermediate layer of the first acoustic wave resonator is greater than the thickness of the intermediate layer of the second acoustic wave resonator.

9. The ladder filter according to claim 6, wherein the intermediate layer is not a monocrystal layer, and an orientation of the intermediate layer is lower than an orientation of the piezoelectric layer.

10. The ladder filter according to claim 6, wherein the intermediate layer is not a monocrystal layer, and the intermediate layer has no orientation.

11. The ladder filter according to claim 6, wherein the intermediate layer is not a monocrystal layer, and a thickness of the intermediate layer is less than or equal to about 150 nm.

12. The ladder filter according to claim 6, further comprising a non-monocrystal layer provided on the intermediate layer so as to cover the functional electrode; wherein the intermediate layer is not a monocrystal layer; and a material of the non-monocrystal layer is a same type as a material of the piezoelectric layer, and an electromechanical coupling coefficient of the non-monocrystal layer is smaller than an electromechanical coupling coefficient of the piezoelectric layer.

13. The ladder filter according to claim 12, wherein a thickness of the non-monocrystal layer is less than or equal to about 150 nm.

14. The ladder filter according to claim 6, further comprising a non-monocrystal layer provided on a principal surface on which the intermediate layer is not provided, of the first principal surface and the second principal surface of the piezoelectric layer; wherein a material of the non-monocrystal layer is a same type as a material of the piezoelectric layer, and an electromechanical coupling coefficient of the non-monocrystal layer is smaller than an electromechanical coupling coefficient of the piezoelectric layer.

15. The ladder filter according to claim 6, wherein the intermediate layer is not a monocrystal layer, and an effective dielectric constant of the intermediate layer is greater than or equal to 40 and less than or equal to 50.

16. An acoustic wave device comprising:

a piezoelectric board including a piezoelectric layer with a first principal surface and a second principal surface opposed to each other;

an intermediate layer on the first principal surface or the second principal surface of the piezoelectric layer; and a functional electrode on the intermediate layer; wherein a material of the intermediate layer is a same type as a material of the piezoelectric layer, and an electromechanical coupling coefficient of the intermediate layer is smaller than an electromechanical coupling coefficient of the piezoelectric layer; and the functional electrode is an interdigital transducer electrode including a plurality of electrode fingers.

17. The acoustic wave device according to claim 16, wherein the acoustic wave device is structured to generate bulk waves in a thickness-shear mode.

18. The acoustic wave device according to claim 17, wherein the piezoelectric layer is a lithium tantalate layer or a lithium niobate layer; and Euler angles ($\phi$, $\theta$, $\psi$) of the piezoelectric layer satisfy expression (1), expression (2), or expression (3):

$$(0°\pm10°,0° \text{ to } 20°, \text{any } \psi) \qquad (1)$$

$$\begin{aligned}(0°\pm10°,20° \text{ to } 80°,0° \text{ to } 60°(1-(\theta-50)^2/900)^{1/2}) \text{ or} \\ (0°\pm10°,20° \text{ to } 80°,[180°-60°(1-(\theta-50)^2/900)^{1/} \\ {}^2] \text{ to } 180°)\end{aligned} \qquad (2)$$

$$(0°\pm10°,[180°-30°(1-(\psi-90)^2/8100)^{1/2}] \text{ to } 180°, \text{any } \psi) \qquad (3).$$

19. The acoustic wave device according to claim 18, wherein the piezoelectric layer is a lithium niobate layer.

20. The acoustic wave device according to claim 16, wherein the piezoelectric board includes a support, the piezoelectric layer is provided on the support, and an acoustic reflection portion is provided in the support;

the acoustic reflection portion overlaps the interdigital transducer electrode in a plan view; and where a thickness of the piezoelectric layer is d and a center-to-center distance between any adjacent two of the plurality of electrode fingers is p, d/p is less than or equal to about 0.5.

21. The acoustic wave device according to claim 20, wherein d/p is less than or equal to about 0.24.

22. The acoustic wave device according to claim 20, wherein the acoustic reflection portion includes a cavity portion.

23. The acoustic wave device according to claim 20, wherein, when viewed in a direction in which any adjacent two of the plurality of electrode fingers are opposed to each other, a region in which the any adjacent two of the plurality of electrode fingers overlap each other is an excitation region, and, where a metallization ratio of the plurality of electrode fingers to the excitation region is MR, MR≤about 1.75(d/p)+0.075 is satisfied.

24. An acoustic wave device comprising:

a piezoelectric board including a piezoelectric layer with a first principal surface and a second principal surface opposed to each other;

an intermediate layer on the first principal surface or the second principal surface of the piezoelectric layer; and a functional electrode on the intermediate layer; wherein a material of the intermediate layer is a same type as a material of the piezoelectric layer, and an electromechanical coupling coefficient of the intermediate layer is smaller than an electromechanical coupling coefficient of the piezoelectric layer;

the piezoelectric board includes a high acoustic velocity material layer, and the piezoelectric layer is provided on the high acoustic velocity material layer; and an acoustic velocity of bulk waves to propagate in the high acoustic velocity material layer is higher than an acoustic velocity of acoustic waves to propagate in the piezoelectric layer.

25. The acoustic wave device according to claim 24, wherein the piezoelectric board includes a low acoustic velocity film between the high acoustic velocity material layer and the piezoelectric layer; and an acoustic velocity of bulk waves to propagate in the low acoustic velocity film is lower than an acoustic velocity of bulk waves to propagate in the piezoelectric layer.

\* \* \* \* \*